(12) United States Patent
Hwang et al.

(10) Patent No.: US 8,076,772 B2
(45) Date of Patent: Dec. 13, 2011

(54) PRINTED CIRCUIT BOARD, MEMORY MODULE HAVING THE SAME AND FABRICATION METHOD THEREOF

(75) Inventors: Hyung-Mo Hwang, Chungcheongnam-do (KR); Yong-Hyun Kim, Gyeonggi-do (KR); Jung-Chan Cho, Chungcheongnam-do (KR); Hyun-Seok Choi, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 651 days.

(21) Appl. No.: 12/146,356

(22) Filed: Jun. 25, 2008

(65) Prior Publication Data

US 2008/0315402 A1     Dec. 25, 2008

(30) Foreign Application Priority Data

Jun. 25, 2007 (KR) ........................ 10-2007-0062373

(51) Int. Cl.
*H01L 23/34* (2006.01)
*H01L 23/10* (2006.01)

(52) U.S. Cl. ................ 257/706; 257/E23.101; 257/707; 257/723; 361/704; 361/760; 438/122; 174/254; 174/258

(58) Field of Classification Search ........... 257/E23.101, 257/706, 707, 712, 723; 361/704, 707–709, 361/719, 760; 438/122, 125; 174/254, 258, 174/261
See application file for complete search history.

(56) References Cited

U.S. PATENT DOCUMENTS

| | | | | |
|---|---|---|---|---|
| 5,229,916 A * | 7/1993 | Frankeny et al. | ............. | 361/718 |
| 5,265,322 A * | 11/1993 | Fisher et al. | .................... | 29/848 |
| 5,386,341 A * | 1/1995 | Olson et al. | .................... | 361/749 |
| 5,448,511 A * | 9/1995 | Paurus et al. | .................... | 365/52 |
| 5,717,556 A * | 2/1998 | Yanagida | ...................... | 361/803 |
| 5,995,370 A * | 11/1999 | Nakamori | ...................... | 361/704 |
| 6,462,412 B2 * | 10/2002 | Kamei et al. | .................. | 257/723 |
| 6,486,544 B1 * | 11/2002 | Hashimoto | .................. | 257/686 |
| 6,501,661 B1 * | 12/2002 | Moore et al. | .................. | 361/752 |
| 6,646,335 B2 * | 11/2003 | Emoto | ......................... | 257/686 |
| 6,670,217 B2 * | 12/2003 | Milla et al. | .................... | 438/107 |
| 6,699,730 B2 * | 3/2004 | Kim et al. | ..................... | 438/107 |
| 6,927,344 B1 * | 8/2005 | Gall et al. | ..................... | 174/254 |
| 6,964,886 B2 * | 11/2005 | Kinsman | ....................... | 438/125 |
| 6,982,869 B2 * | 1/2006 | Larson | ..................... | 361/679.32 |
| 7,149,095 B2 * | 12/2006 | Warner et al. | ................ | 361/803 |
| 2002/0001180 A1 | 1/2002 | Kawamura | | |
| 2006/0050488 A1 * | 3/2006 | Goodwin | ....................... | 361/749 |
| 2006/0050489 A1 * | 3/2006 | Wehrly et al. | ................ | 361/749 |

FOREIGN PATENT DOCUMENTS

| | | |
|---|---|---|
| JP | 5-259650 | 10/1993 |
| JP | 2001-168268 | 6/2001 |
| JP | 2003-338602 | 11/2003 |
| JP | 2004-128418 | 4/2004 |
| KR | 1998-058412 | 10/1998 |

* cited by examiner

*Primary Examiner* — Chris Chu
(74) *Attorney, Agent, or Firm* — Volentine & Whitt, PLLC

(57) ABSTRACT

A printed circuit board, a memory module having the same, and a fabrication method thereof. The printed circuit board includes an interconnection substrate on which electronic components are mounted and in which a plurality of signal lines are arranged. The signal lines are electrically coupled to the electronic components. A heat sink is disposed on one surface of the interconnection substrate to dissipate heat of the electronic components, and in which no signal lines are arranged. The printed circuit board includes a bending substrate coupling the interconnection substrate to the heat sink, and formed of a flexible material configured to be bent.

7 Claims, 16 Drawing Sheets

PRINTED CIRCUIT BOARD, MEMORY MODULE HAVING THE SAME AND FABRICATION METHOD THEREOF

CROSS-REFERENCE TO RELATED APPLICATION

This application claims the benefit of Korean Patent Application No. 2007-0062373, filed Jun. 25, 2007, the disclosure of which is hereby incorporated herein by reference in its entirety.

BACKGROUND OF THE INVENTION

1. Field of the Invention

The present invention relates to a printed circuit board, on which electronic components are mounted, a memory module having the same, and a fabrication method thereof.

2. Description of the Related Art

As electronic products become lighter, thinner, shorter and smaller, semiconductor packages as their core devices are also miniaturized. For miniaturization of the packages, various methods have been proposed and attempted.

Conventionally, a method of miniaturizing the packages may include a Multi-Chip Package (MCP) and a Multi-Chip Module (MCM) on which a plurality of chips or packages are mounted. In the case of the MCM, semiconductor chips and semiconductor packages are mainly mounted on a printed circuit board in a two-dimensional array. In particular, in memory modules which are mounted in a computer as a major application of semiconductor products among the MCM, a plurality of unit memory devices having a desired capacity which are mounted on a printed circuit board by soldering are inserted into a socket of a main body of the computer.

Generally, one to several tens of unit memory devices can be mounted on a single printed circuit board used as a memory module. The unit memory device has a package shape in which a memory chip having a unit memory capacity is mounted therein. In addition, the unit memory device has a structure in which external connection terminals coupled to the memory chip are arranged at the exterior of the package.

However, since the conventional memory module is limited in the number of unit memory devices mounted on the printed circuit board, in order to increase the memory capacity of the memory module, the memory capacity of each unit memory device should be increased. In addition, in order to increase the capacity of a semiconductor chip installed in the unit memory device, it is currently necessary to develop technology for integrating a higher number of cells in a limited space of the semiconductor chip. However, this technology requires a considerable amount of development time due to requirements of precision and finer line width.

More recently, in order to solve these problems, a method of stacking the currently developed memory modules in a three-dimensional array has been proposed. However, when the memory modules are disposed in the three-dimensional array, it results in thermal problems. That is, since the unit memory device mounted on the memory module generates a large amount of heat during operation (when the memory modules are stacked in the three-dimensional array) the thermal problems of the unit memory device cause malfunction of the device at a specific temperature, e.g., about 80° C. or higher.

SUMMARY OF THE INVENTION

An embodiment of the present invention provides a printed circuit board, a memory module having the same and a fabrication method thereof capable of improving thermal characteristics of products such as unit memory devices.

In one aspect, the present invention is directed to a printed circuit board. The printed circuit board may include: a first interconnection substrate on which first electronic components are mounted and in which a plurality of first signal lines are electrically coupled to the first electronic components; a first heat sink disposed on one surface of the first interconnection substrate to dissipate heat of the first electronic components; and a first bending substrate coupling the first interconnection substrate to the first heat sink, and formed of a flexible material configured to be bent.

In another embodiment, the printed circuit board may further include a first tab terminal disposed between the first interconnection substrate and the first bending substrate to couple the first interconnection substrate to the first bending substrate, and having second signal lines coupled to the first signal lines to transmit signals from the exterior to the first electronic components; and a second tab terminal disposed between the first heat sink and the first bending substrate to couple the first heat sink to the first bending substrate, and having third signal lines coupled to the first signal lines to transmit signals from the exterior to the first electronic components. An end portion of the first heat sink disposed adjacent to the second tab terminal may extend to a center portion of a first surface of the first bending substrate via a first surface of the second tab terminal.

In still another embodiment, the printed circuit board may further include a second bending substrate disposed between the first interconnection substrate and the first tab terminal to couple the first interconnection substrate to the first tab terminal, and formed of a flexible material configured to be bent.

In yet another embodiment, the first heat sink may be formed of a metal material or plated with a metal material in which no signal lines are arranged.

In further another embodiment, the printed circuit board may further include: a second interconnection substrate disposed on the other surface of the first interconnection substrate, on which second electronic components are mounted, and in which a plurality of second signal lines are electrically coupled to the second electronic components; a second bending substrate coupling the second interconnection substrate to the first interconnection substrate, and formed of a flexible material configured to be bent; a first tab terminal disposed between the second interconnection substrate and the second bending substrate to couple the second interconnection substrate to the second bending substrate, and having third signal lines coupled to the first and second signal lines to transmit signals from the exterior to the first and second electronic components; and a second tab terminal disposed between the first interconnection substrate and the second bending substrate to couple the first interconnection substrate to the second bending substrate, and having fourth signal lines coupled to the first and second signal lines to transmit signals from the exterior to the first and second electronic components.

In still yet another embodiment, the printed circuit board may further include: a third bending substrate disposed between the second interconnection substrate and the first tab terminal to couple the second interconnection substrate to the first tab terminal, and formed of a flexible material configured to be bent; and a fourth bending substrate disposed between the first interconnection substrate and the second tab terminal to couple the first interconnection substrate to the second tab terminal, and formed of a flexible material configured to be bent.

In still further embodiment, the printed circuit board may further include: a second heat sink disposed on one surface of the second interconnection substrate to dissipate heat of the second electronic components, and in which no signal lines are arranged; and a third bending substrate coupling the second interconnection substrate to the second heat sink, and formed of a flexible material configured to be bent. The second heat sink may be formed of a metal material or plated with a metal material.

In another aspect, the present invention is directed to a memory module. The memory module may include: a printed circuit board comprising a first interconnection substrate in which a plurality of first signal lines are arranged, a first heat sink disposed adjacent to a first surface of the first interconnection substrate and in which no signal lines are arranged, and a first bending substrate coupling the first interconnection substrate to the first heat sink and formed of a flexible material; a plurality of first semiconductor packages mounted on a first surface of the first interconnection substrate opposite to the first heat sink, the first semiconductor packages being electrically coupled to the first signal lines; and a first thermal interface adhesive configured to adhere the first semiconductor packages to a first surface of the first heat sink opposite to the first semiconductor packages, and configured to transmit heat from the first semiconductor packages to the first heat sink.

In another embodiment, the memory module may further include: a plurality of second semiconductor packages mounted on a second surface of the first interconnection substrate opposite to the first surface of the first interconnection substrate, the second semiconductor packages being electrically coupled to the first signal lines; and an advanced memory buffer (AMB) mounted on the first surface of the first interconnection substrate, the AMB being electrically coupled to the first signal lines, and configured to transmit signals from the exterior to the first and second semiconductor packages. In this case, the first thermal interface adhesive may be coated on the first surface of the first heat sink to adhere the AMB to the first surface of the first heat sink, and configured to transmit heat from the AMB toward the first heat sink.

In still another embodiment, the printed circuit board may further include: a first tab terminal disposed between the first interconnection substrate and the first bending substrate to couple the first interconnection substrate to the first bending substrate, the first tab terminal having second signal lines coupled to the first signal lines to transmit signals from the exterior to the AMB, and adhered along one side of the first surface of the first heat sink; and a second tab terminal disposed between the first heat sink and the first bending substrate to couple the first heat sink to the first bending substrate, the second tab terminal having third signal lines coupled to the first signal lines to transmit signals from the exterior to the AMB, and adhered along one side of the second surface of the first heat sink to correspond to the first tab terminal. In this case, an end portion of the first heat sink disposed adjacent to the second tab terminal may extend to a center portion of the first surface of the first bending substrate via the first surface of the second tab terminal.

In yet another embodiment, the printed circuit board may further include a second bending substrate disposed between the first interconnection substrate and the first tab terminal to couple the first interconnection substrate to the first tab terminal, and formed of a flexible material configured to be bent.

In further another embodiment, the first heat sink may be formed of a metal material or plated with a metal material.

In yet still another embodiment, a label may be attached to a second surface of the first heat sink opposite to the first surface of the first heat sink.

In yet further another embodiment, the printed circuit board may further include: a second interconnection substrate disposed adjacent to the second surface of the first heat sink opposite to the first surface of the first heat sink and having a plurality of second signal lines arranged therein, and a second bending substrate coupling the second interconnection substrate to the first interconnection substrate and formed of a flexible material.

In this case, the memory module may further include: a plurality of second semiconductor packages mounted on the second surface of the first interconnection substrate opposite to the first surface of the first interconnection substrate, the second semiconductor packages being electrically coupled to the first signal lines; a plurality of third semiconductor packages mounted on the first surface of the second interconnection substrate opposite to the first heat sink, the third semiconductor packages being electrically coupled to the second signal lines; a plurality of fourth semiconductor packages mounted on the second surface of the second interconnection substrate opposite to the first surface of the second interconnection substrate, the fourth semiconductor packages being electrically coupled to the second signal lines; an AMB mounted on the first surface of the second interconnection substrate, the AMB being electrically coupled to the first and second signal lines and configured to transmit signals from the exterior to the first, second, third, and fourth semiconductor packages; and a second thermal interface adhesive configured to adhere the third semiconductor packages to the second surface of the first heat sink opposite to the third semiconductor packages, and configured to transmit heat from the third semiconductor packages toward the first heat sink. At this time, the first thermal interface adhesive may be coated on the first surface of the first heat sink, and the second thermal interface adhesive may be coated on the second surface of the first heat sink.

In another embodiment, the printed circuit board may further include: a first tab terminal disposed between the second interconnection substrate and the second bending substrate to couple the second interconnection substrate to the second bending substrate, the first tab terminal having third signal lines coupled to the first and second signal lines to transmit signals from the exterior to the AMB, and adhered along one side of the second surface of the first heat sink; and a second tab terminal disposed between the first interconnection substrate and the second bending substrate to couple the first interconnection substrate to the second bending substrate, the second tab terminal having fourth signal lines coupled to the first and second signal lines to transmit signals from the exterior to the AMB, and adhered along one side of the first surface of the first heat sink to correspond to the first tab terminal.

In still another embodiment, the printed circuit board may further include: a third bending substrate disposed between the second interconnection substrate and the first tab terminal to couple the second interconnection substrate to the first tab terminal, and formed of a flexible material configured to be bent; and a fourth bending substrate disposed between the first interconnection substrate and the second tab terminal to couple the first interconnection substrate and the second tab terminal, and formed of a flexible material configured to be bent.

In yet another embodiment, the printed circuit board may further include: a second heat sink disposed adjacent to the second surface of the second interconnection substrate opposite to the first surface of the second interconnection substrate, and in which no signal lines are arranged; and a third bending substrate coupling the second interconnection substrate to the second heat sink and formed of a flexible material.

In this case, the memory module may further include: a plurality of second semiconductor packages mounted on the second surface of the first interconnection substrate, the second semiconductor packages being electrically coupled to the first signal lines; a plurality of third semiconductor packages mounted on the first surface of the second interconnection substrate, the third semiconductor packages being electrically coupled to the second signal lines; a plurality of fourth semiconductor packages mounted on the second surface of the second interconnection substrate, the fourth semiconductor packages being electrically coupled to the second signal lines; an AMB mounted on the second surface of the second interconnection substrate, the AMB being electrically coupled to the first and second signal lines and configured to transmit signals from the exterior to the first, second, third, and fourth semiconductor packages; a second thermal interface adhesive configured to adhere the third semiconductor packages to the second surface of the first heat sink and configured to transmit heat from the third semiconductor packages toward the first heat sink; and a third thermal interface adhesive configured to adhere the fourth semiconductor packages and the AMB to the first surface of the second heat sink opposite to the fourth semiconductor packages and configured to transmit heat from the fourth semiconductor packages and the AMB toward the second heat sink. At this time, the first thermal interface adhesive may be coated on the first surface of the first heat sink, the second thermal interface adhesive may be coated on the second surface of the first heat sink, and the third thermal interface adhesive may be coated on the first surface of the second heat sink.

In another embodiment, a label may be attached to the second surface of the second heat sink opposite to the first surface of the second heat sink.

In still another aspect, the present invention is directed to a method of fabricating a memory module including: preparing a printed circuit board comprising an interconnection substrate in which a plurality of first signal lines are arranged, a heat sink disposed on one surface of the interconnection substrate and in which no signal lines are arranged, and a bending substrate coupling the interconnection substrate to the heat sink and formed of a flexible material to be bent; mounting a plurality of first semiconductor packages on an upper surface of the interconnection substrate to be electrically coupled to the first signal lines; coating a thermal interface adhesive on an upper surface of the heat sink to adhere the first semiconductor packages; and bending the bending substrate to adhere the first semiconductor packages on the upper surface of the heat sink by the thermal interface adhesive.

In another embodiment, the method may further include: mounting a plurality of second semiconductor packages on a lower surface of the interconnection substrate to be electrically coupled to the first signal lines, and mounting an AMB on an upper surface of the interconnection substrate to be electrically coupled to the first signal lines to transmit signals from the exterior to the first and second semiconductor packages.

In still another embodiment, the method may further include attaching a label to a lower surface of the heat sink.

In yet another aspect, the present invention is directed to a method of fabricating a memory module including: preparing a printed circuit board comprising a first interconnection substrate in which a plurality of first signal lines are arranged, a heat sink disposed on one surface of the first interconnection substrate and in which no signal lines are arranged, a first bending substrate coupling the first interconnection substrate to the heat sink and formed of a flexible material to be bent, a second bending substrate disposed on the other surface of the first interconnection substrate and having a plurality of second signal lines arranged therein, and a second bending substrate coupling the second interconnection substrate to the first interconnection substrate and formed of a flexible material to be bent; mounting a plurality of first semiconductor packages on an upper surface of the first interconnection substrate to be electrically coupled to the first signal lines; mounting a plurality of second semiconductor packages on an upper surface of the second interconnection substrate to be electrically coupled to the second signal lines; coating a first thermal interface adhesive on an upper surface of the heat sink to adhere the first semiconductor packages; coating a second thermal interface adhesive on a lower surface of the heat sink to adhere the second semiconductor packages; bending the first bending substrate to adhere the first semiconductor packages on the upper surface of the heat sink by the first thermal interface adhesive; and bending the second bending substrate to adhere the second semiconductor packages to a lower surface of the heat sink by the second thermal interface adhesive.

In another embodiment, the method may further include: mounting a plurality of third semiconductor packages on a lower surface of the first interconnection substrate to be electrically coupled to the first signal lines; mounting a plurality of fourth semiconductor packages on a lower surface of the second interconnection substrate to be electrically coupled to the second signal lines; and mounting an AMB on the upper surface of the second interconnection substrate to be electrically coupled to the first and second signal lines to transmit signals from the exterior to the first, second, third, and fourth semiconductor packages.

In further another aspect, the present invention is directed to a method of fabricating a memory module including: preparing a printed circuit board comprising a first interconnection substrate in which a plurality of first signal lines are arranged, a first heat sink disposed on one surface of the first interconnection substrate and in which no signal lines are arranged, a first bending substrate coupling the first interconnection substrate to the first heat sink and formed of a flexible material to be bent, a second interconnection substrate disposed on the other surface of the first interconnection substrate and having a plurality of second signal lines arranged therein, a second bending substrate coupling the second interconnection substrate to the first interconnection substrate and formed of a flexible material to be bent, a second heat sink disposed on one surface of the second interconnection substrate and in which no signal lines are arranged, and a third bending substrate coupling the second interconnection substrate to the second heat sink and formed of a flexible material to be bent; mounting a plurality of first semiconductor packages on an upper surface of the first interconnection substrate to be electrically coupled to the first signal lines; mounting a plurality of second semiconductor packages on an upper surface of the second interconnection substrate to be electrically coupled to the second signal lines; mounting a plurality of third semiconductor packages on a lower surface of the second interconnection substrate to be electrically coupled to the second signal lines; coating a first thermal interface adhesive on an upper surface of the first heat sink to adhere the first semiconductor packages; coating a second thermal interface adhesive on a lower surface of the first heat sink to adhere the second semiconductor packages; coating a third thermal interface adhesive on a lower surface of the second heat sink to adhere the third semiconductor packages; bending the first bending substrate to adhere the first semiconductor packages on an upper surface of the first heat sink by the first thermal interface adhesive material; bending the second bending substrate to adhere the second semiconductor packages to a lower surface of the first heat sink by the second thermal interface adhesive; and bending the third bending substrate to adhere the third semiconductor packages to a lower surface of the second heat sink by the third thermal interface adhesive.

In another embodiment, the method may further include: mounting a plurality of fourth semiconductor packages on a lower surface of the first interconnection substrate to be electrically coupled to the first signal lines; and mounting an AMB on a lower surface of the second interconnection substrate to be electrically coupled to the first and second signal lines to transmit signals from the exterior to the first, second, third, and fourth semiconductor packages.

In still another embodiment, the method may further include attaching a label on an upper surface of the second heat sink.

BRIEF DESCRIPTION OF THE DRAWINGS

The foregoing and other objects, features and advantages of the present invention will be apparent from the more particular description of an exemplary embodiment of the present invention, as illustrated in the accompanying drawing. The drawing is not necessarily to scale, emphasis instead being placed upon illustrating the principles of the present invention.

DETAILED DESCRIPTION OF THE INVENTION

Figure 1:
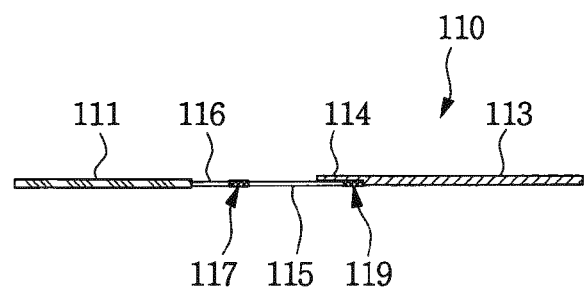
FIG. 1 is a side view of a printed circuit board in accordance with a first exemplary embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. In addition, when a layer is described to be formed on other layer or on a substrate, it means that the layer may be formed on the other layer or on the substrate, or a third layer may be interposed between the layer and the other layer or the substrate. Like numerals refer to like elements throughout the specification.

First Embodiment of Printed Circuit Board

Figure 2:
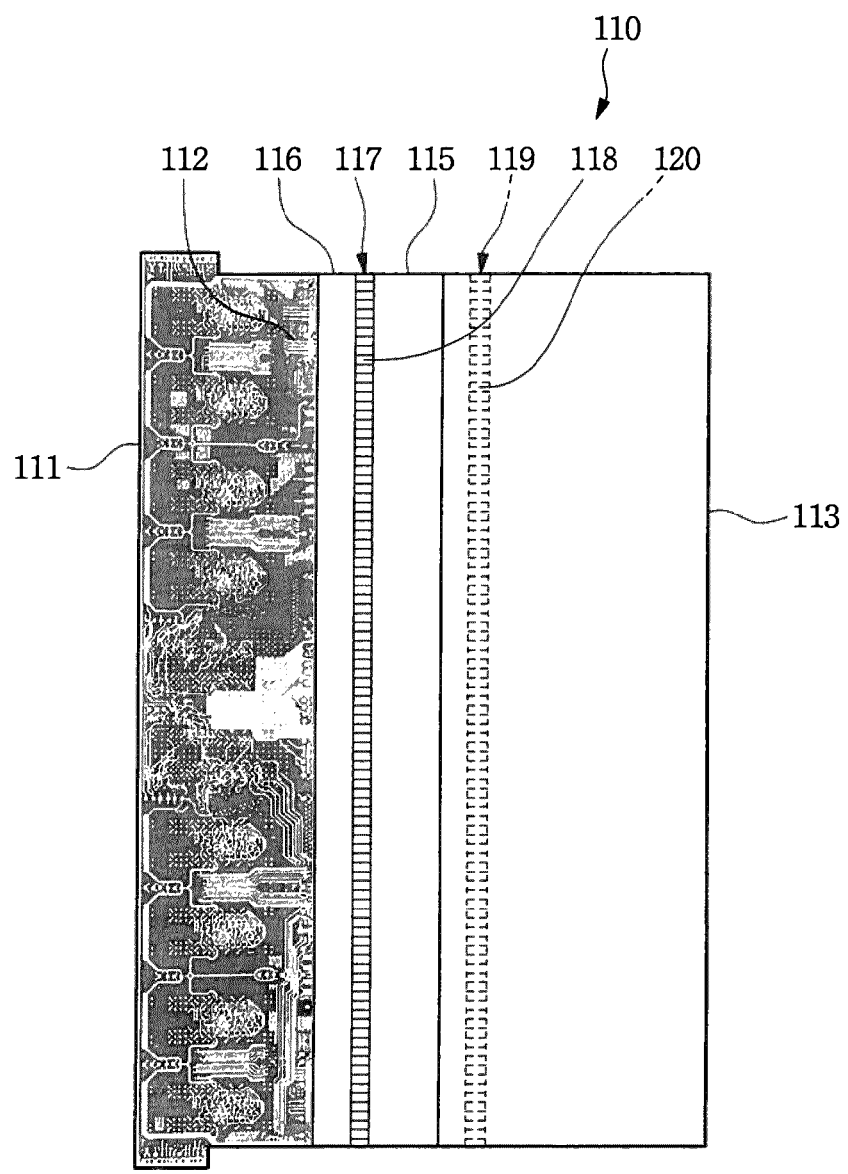
FIG. 2 is a plan view of the printed circuit board of FIG. 1.

FIG. 1 is a side view of a printed circuit board in accordance with a first exemplary embodiment of the present invention, and FIG. 2 is a plan view of the printed circuit board of FIG. 1.

Referring to FIGS. 1 and 2, a printed circuit board 110 in accordance with a first exemplary embodiment of the present invention may include an interconnection substrate 111 on which electronic components are mounted, a heat sink 113 disposed to dissipate heat of the electronic components, a first bending substrate 115 coupling the interconnection substrate 111 to the heat sink 113, a first tab terminal 117 disposed between the interconnection substrate 111 and the first bending substrate 115 to couple the interconnection substrate 111 to the first bending substrate 115, a second tab terminal 119 disposed between the heat sink 113 and the first bending substrate 115 to couple the heat sink 113 to the first bending substrate 115, and a second bending substrate 116 disposed between the interconnection substrate 111 and the first tab terminal 117 to couple the interconnection substrate 111 to the first tab terminal 117, which may be integrally formed with each other.

Specifically, a plurality of first signal lines 112 are arranged in the interconnection substrate 111. Therefore, the electronic components mounted on the interconnection substrate 111 are electrically coupled to the first signal lines 112. The electronic components may be mounted on any one surface of the interconnection substrate 111, or mounted on both surfaces thereof. The interconnection substrate 111 may be a flexible substrate formed of a flexible material, or a rigid substrate formed of a rigid material.

The heat sink 113 has no signal line arranged therein, and is disposed on one surface of the interconnection substrate 111. The heat sink 113 may be formed of a metal material or plated with a metal material in order to improve thermal dissipation properties. In order to improve thermal dissipation properties, copper (Cu), tin (Sn), nickel (Ni), gold (Au), aluminum (Al), and so on, may be used in the metal material. Here, the heat sink 113 may be fabricated simultaneously with fabricating the interconnection substrate 111.

The first bending substrate 115 and the second bending substrate 116 may be formed of a flexible material to be bent. Therefore, the first bending substrate 115 may be bent such that any one of the interconnection substrate 111 and the heat sink 113 is opposite to or in contact with each other. In addition, the interconnection substrate 111 and the first tab terminal 117 may not be disposed on a straight line due to bending of the second bending substrate 116. The first bending substrate 115 and the second bending substrate 116 may also be fabricated simultaneously with fabricating the interconnection substrate 111.

The first tab terminal 117 includes second signal lines 118 coupled to the first signal lines 112. Some of the second signal lines 118 may be exposed to the exterior. Therefore, signals from the exterior may be transmitted to the second signal lines 118 through the externally exposed part, and the transmitted signals may be transferred to the electronic components through the second signal lines 118.

The second tab terminal 119 includes third signal lines 120 coupled to the first signal lines 112. Some of the third signal lines 120 may be exposed to the exterior. Therefore, signals from the exterior may be transmitted to the third signal lines 120 through the externally exposed part, and the transmitted signals may be transmitted to the electronic components through the third signal lines 120.

Meanwhile, an end portion 114 of the heat sink 113 disposed adjacent to the second tab terminal 119 may extend to a center portion of a first surface of the first bending substrate 115 via a first surface, for example, an upper surface of the second tab terminal 119. Therefore, the first bending substrate 115 may be bent in a direction to surround an extension of the heat sink 113, and the first tab terminal 117 may be attached to the extension. Here, the first tab terminal 117 and the second tab terminal 119 may also be fabricated simultaneously with fabricating the interconnection substrate 111. That is, even though in the printed circuit board 110 the interconnection substrate 111 and the heat sink 113 may be separately fabricated and then attached to each other, other parts may be fabricated simultaneously with fabricating the interconnection substrate 111.

Second Embodiment of Printed Circuit Board

Figure 3:
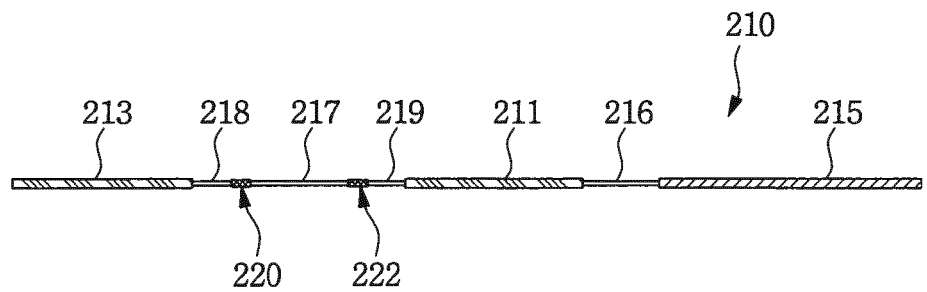
FIG. 3 is a side view of a printed circuit board in accordance with a second exemplary embodiment of the present invention.
Figure 4:
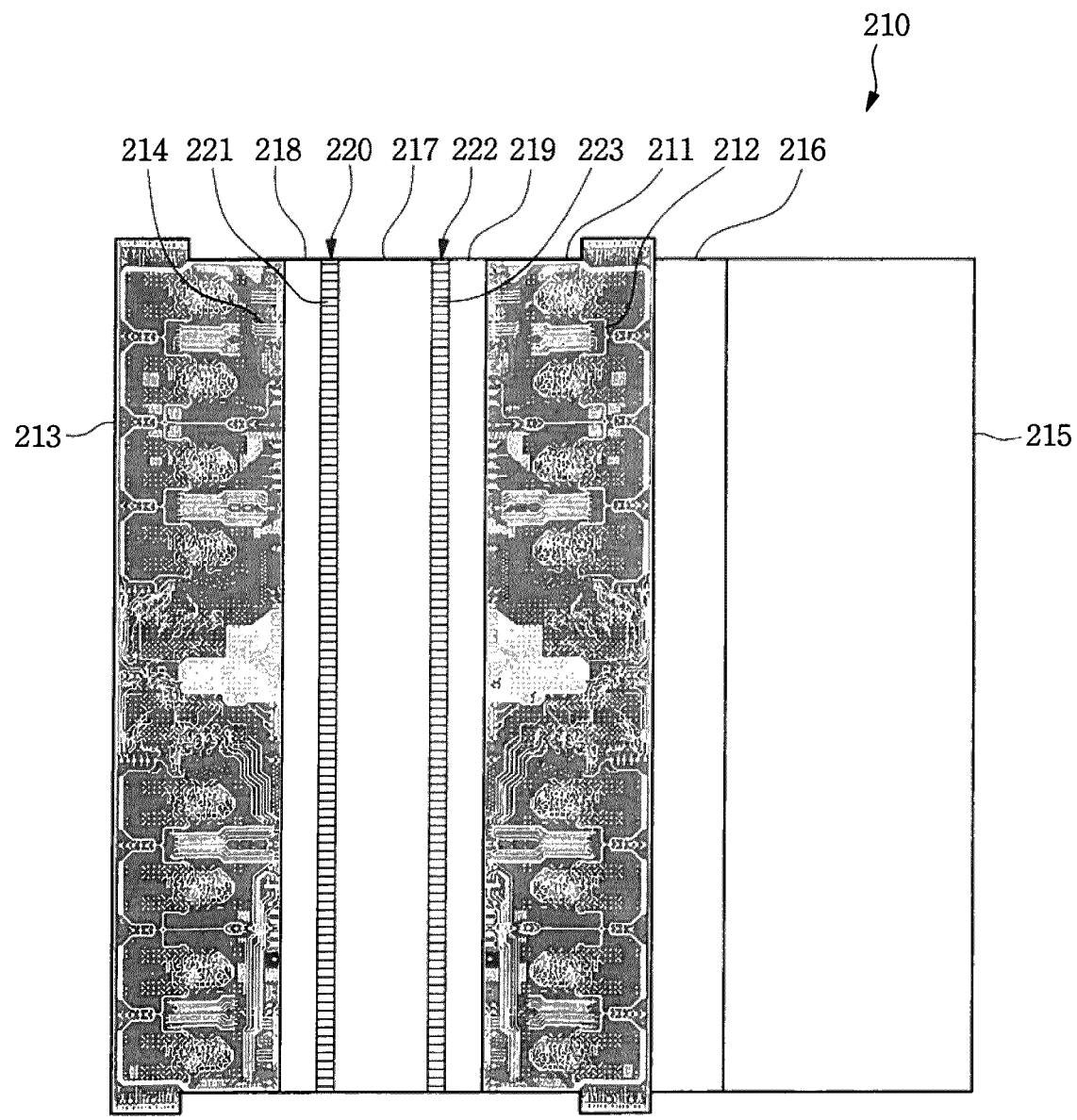
FIG. 4 is a plan view of the printed circuit board of FIG. 3.

FIG. 3 is a side view of a printed circuit board in accordance with a second exemplary embodiment of the present invention, and FIG. 4 is a plan view of the printed circuit board of FIG. 3.

Referring to FIGS. 3 and 4, a printed circuit board 210 in accordance with a second exemplary embodiment of the present invention may include a first interconnection substrate 211 on which first electronic components are mounted, a second interconnection substrate 213 on which second electronic components are mounted, a heat sink 215 disposed to dissipate heat of the electronic components, a first bending substrate 216 coupling the first interconnection substrate 211 to the heat sink 215, a second bending substrate 217 coupling the second interconnection substrate 213 to the first interconnection substrate 211, a first tab terminal 220 disposed between the second interconnection substrate 213 and the second bending substrate 217 to couple the second interconnection substrate 213 to the second bending substrate 217, a second tab terminal 222 disposed between the first interconnection substrate 211 and the second bending substrate 217 to couple the interconnection substrate 211 to the second bending substrate 217, a third bending substrate 218 disposed between the second interconnection substrate 213 and the first tab terminal 220 to couple the second interconnection substrate 213 to the first tab terminal 220, and a fourth bending substrate 219 disposed between the first interconnection substrate 211 and the second tab terminal 222 to couple the first interconnection substrate 211 to the second tab terminal 222, which may be integrally formed with each other.

Specifically, a plurality of first signal lines 212 are arranged in the first interconnection substrate 211. Therefore, the first electronic components mounted on the first interconnection substrate 211 are electrically coupled to the first signal lines 212. The first electronic components may be mounted on any one surface of the first interconnection substrate 211 or may be mounted on both surfaces thereof. The first interconnection substrate 211 may be a flexible substrate formed of a flexible material, or a rigid substrate formed of a rigid material.

A plurality of second signal lines 214 are arranged in the second interconnection substrate 213. Therefore, the second electronic components mounted on the second interconnection substrate 213 are electrically coupled to the second signal lines 214. The second electronic components may be mounted on any one surface of the second interconnection substrate 213 or may be mounted on both surfaces thereof. The second interconnection substrate 213 may be a flexible substrate formed of a flexible material, or a rigid substrate formed of a rigid material.

The heat sink 215 has no signal line arranged therein, and is disposed on one surface of the first interconnection substrate 211. In order to improve thermal dissipation properties, the heat sink 215 may be formed of a metal material or may be plated with a metal material. The metal material may be copper (Cu), tin (Sn), nickel (Ni), gold (Au), aluminum (Al), and so on. Here, the heat sink 215 may be fabricated simultaneously with fabricating the first interconnection substrate 211.

The first bending substrate 216, the second bending substrate 217, the third bending substrate 218, and the fourth bending substrate 219 may be formed of a flexible material to be bent. Therefore, the heat sink 215 may be bent toward the first interconnection substrate 211 by bending of the first bending substrate 216, and the second interconnection substrate 213 may be bent toward the first interconnection substrate 211 by bending of the second bending substrate 217. In addition, the second interconnection substrate 213 and the first tab terminal 220, and the first interconnection substrate 211 and the second tab terminal 222 may not be disposed on a straight line due to bending of the third bending substrate 218 and the fourth bending substrate 219. Here, the bending substrates 216, 217, 218 and 219 may be fabricated simultaneously with fabricating the interconnection substrates 211 and 213.

The first tab terminal 220 includes third signal lines 221 coupled to the first and second signal lines 212 and 214. Some of the third signal lines 221 may be exposed to the exterior. Therefore, the signals from the exterior can be transmitted to the third signal lines 221 through the externally exposed part, and the transmitted signals can be transferred to the electronic components through the third signal lines 221.

The second tab terminal 222 includes fourth signal lines 223 coupled to the first and second signal lines 212 and 214. Some of the fourth signal lines 223 may be exposed to the exterior. Therefore, the signals from the exterior can be transmitted to the fourth signal lines 223 through the externally exposed part, and the transmitted signals can be transferred to the electronic components through the fourth signal lines 223.

Third Embodiment of Printed Circuit Board

Figure 5:
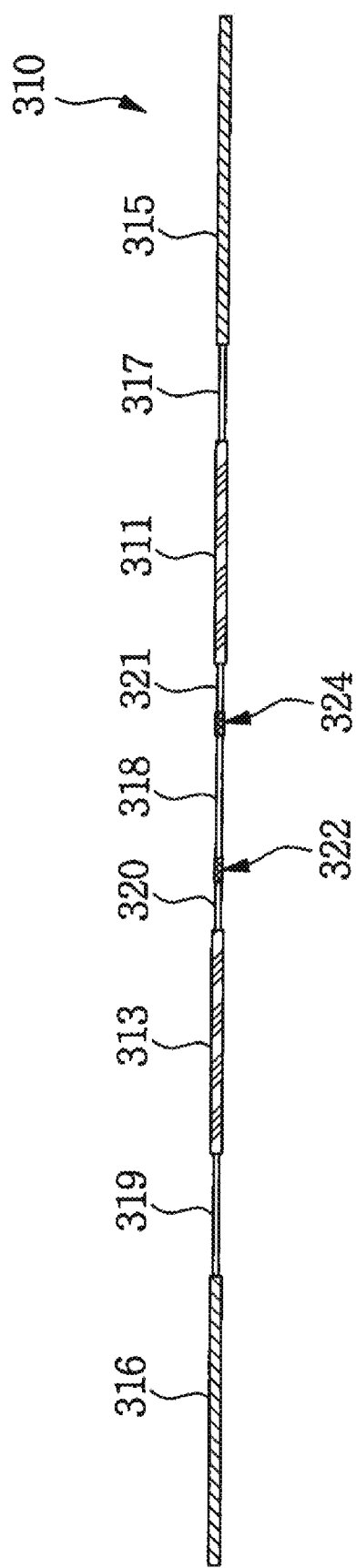
FIG. 5 is a side view of a printed circuit board in accordance with a third exemplary embodiment of the present invention.
Figure 6:
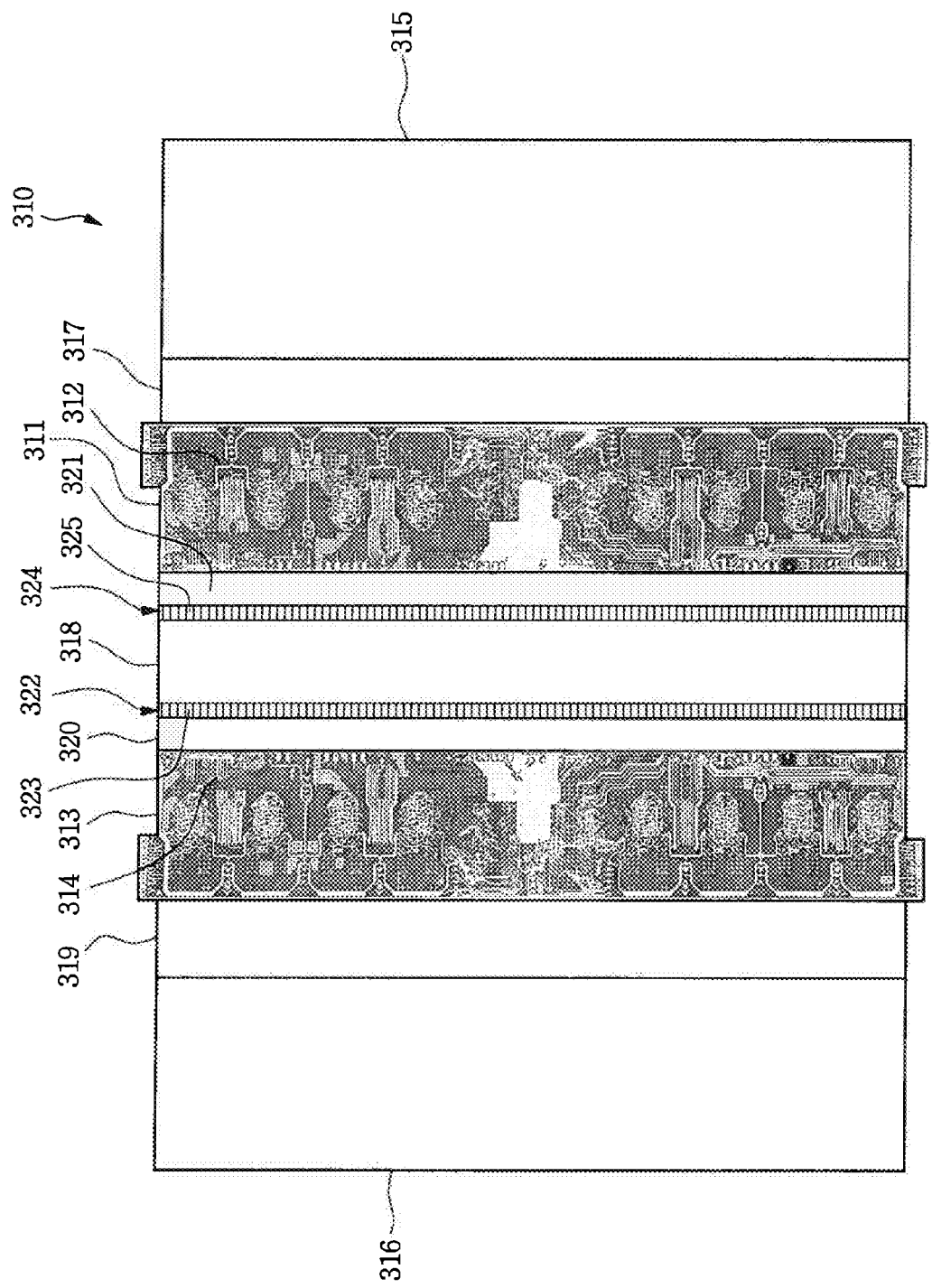
FIG. 6 is a plan view of the printed circuit board of FIG. 5.

FIG. 5 is a side view of a printed circuit board in accordance with a third exemplary embodiment of the present invention, and FIG. 6 is a plan view of the printed circuit board of FIG. 5.

Referring to FIGS. 5 and 6, a printed circuit board 310 in accordance with a third exemplary embodiment of the present invention may include a first interconnection substrate 311 on which first electronic components are mounted, a second interconnection substrate 313 on which second electronic components are mounted, a first heat sink 315 disposed to dissipate heat of the first electronic components, a second heat sink 316 disposed to dissipate heat of the second electronic components, a first bending substrate 317 coupling the first interconnection substrate 311 to the first heat sink 315, a second bending substrate 318 coupling the second interconnection substrate 313 to the first interconnection substrate 311, a third bending substrate 319 coupling the second interconnection substrate 313 to the second heat sink 316, a first tab terminal 322 disposed between the second interconnection substrate 313 and the second bending substrate 318 to couple the second interconnection substrate 313 to the second bending substrate 318, a second tab terminal 324 disposed between the first interconnection substrate 311 and the second bending substrate 318 to couple the first interconnection substrate 311 to the second bending substrate 318, a fourth bending substrate 320 disposed between the second interconnection substrate 313 and the first tab terminal 322 to couple the second interconnection substrate 313 to the first tab terminal 322, and a fifth bending substrate 321 disposed between the first interconnection substrate 311 and the second tab terminal 324 to couple the first interconnection substrate 311 to the second tab terminal 324, which may be integrally formed with each other.

Specifically, a plurality of first signal lines 312 are arranged in the first interconnection substrate 311. Therefore, the first electronic components mounted on the first interconnection substrate 311 are electrically coupled to the first signal lines 312. The first electronic components may be mounted on any one surface of the first interconnection substrate 311 or mounted on both surfaces thereof. The first interconnection substrate 311 may be a flexible substrate formed of a flexible material, or a rigid substrate formed of a rigid material.

A plurality of second signal lines 314 are arranged in the second interconnection substrate 313. Therefore, second electronic components mounted on the second interconnection substrate 313 are electrically coupled to the second signal lines 314. The second electronic components may be mounted on any one surface of the second interconnection substrate 313 or mounted on both surfaces thereof. The second interconnection substrate 313 may be a flexible substrate formed of a flexible material, or a rigid substrate formed of a rigid material, similar to the first interconnection substrate 311.

The first heat sink 315 and the second heat sink 316 have no signal lines arranged therein and are disposed on one surface of the first interconnection substrate 311 and one surface of the second interconnection substrate 313. The first heat sink 315 and the second heat sink 316 may be formed of a metal material or plated with a metal material to improve thermal dissipation properties. The metal material may be copper (Cu), tin (Sn), nickel (Ni), gold (Au), aluminum (Al), and so on. Here, the heat sinks 315 and 316 may be fabricated simultaneously with fabricating the first interconnection substrate 311.

The first bending substrate 317, the second bending substrate 318, the third bending substrate 319, the fourth bending substrate 320, and the fifth bending substrate 321 may be formed of a flexible material to be bent. Therefore, the first heat sink 315 may be bent toward the first interconnection substrate 311 by bending of the first bending substrate 317, the second interconnection substrate 313 may be bent toward the first interconnection substrate 311 by bending of the second bending substrate 317, and the second heat sink 316 may be bent toward the second interconnection substrate 313 by bending of the third bending substrate 319. The second interconnection substrate 313 and the first tab terminal 322, and the first interconnection substrate 311 and the second tab terminal 324 may not be disposed on a straight line by bending of the fourth bending substrate 320 and the fifth bending substrate 321. Here, the bending substrates 317, 318, 319, 320 and 321 may be fabricated simultaneously with fabricating the interconnection substrates 311 and 313.

The first tab terminal 322 includes third signal lines 323 coupled to the first and second signal lines 312 and 314. Some of the third signal lines 323 may be exposed to the exterior. Therefore, signals from the exterior can be transmitted to the third signal lines 323 through the externally exposed part, and the transmitted signals can be transferred to the electronic components through the third signal lines 323.

The second tab terminal 324 includes fourth signal lines 325 coupled to the first and second signal lines 312 and 314. Some of the fourth signal lines 325 may be exposed to the exterior. Therefore, signals from the exterior can be transmitted to the fourth signal lines 325 through the externally exposed part, and the transmitted signals can be transferred to the electronic components through the fourth signal lines 325.

First Embodiment of Memory Module

Figure 7:
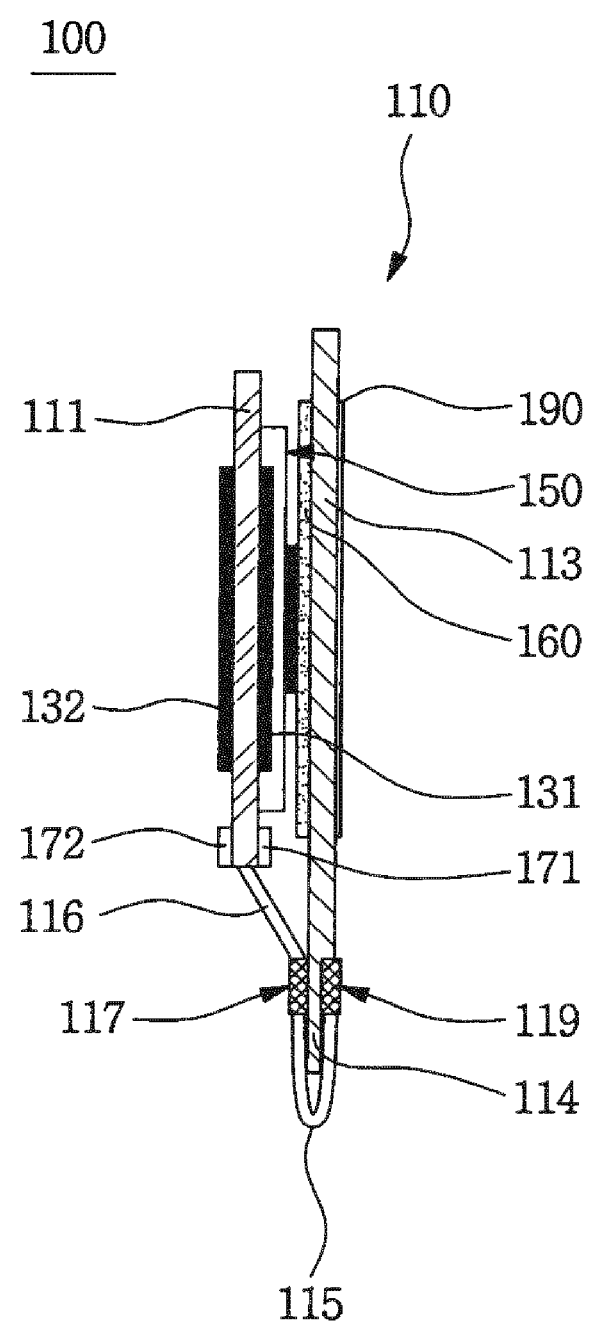
FIG. 7 is a side view of a memory module in accordance with a first exemplary embodiment of the present invention.
Figure 8:
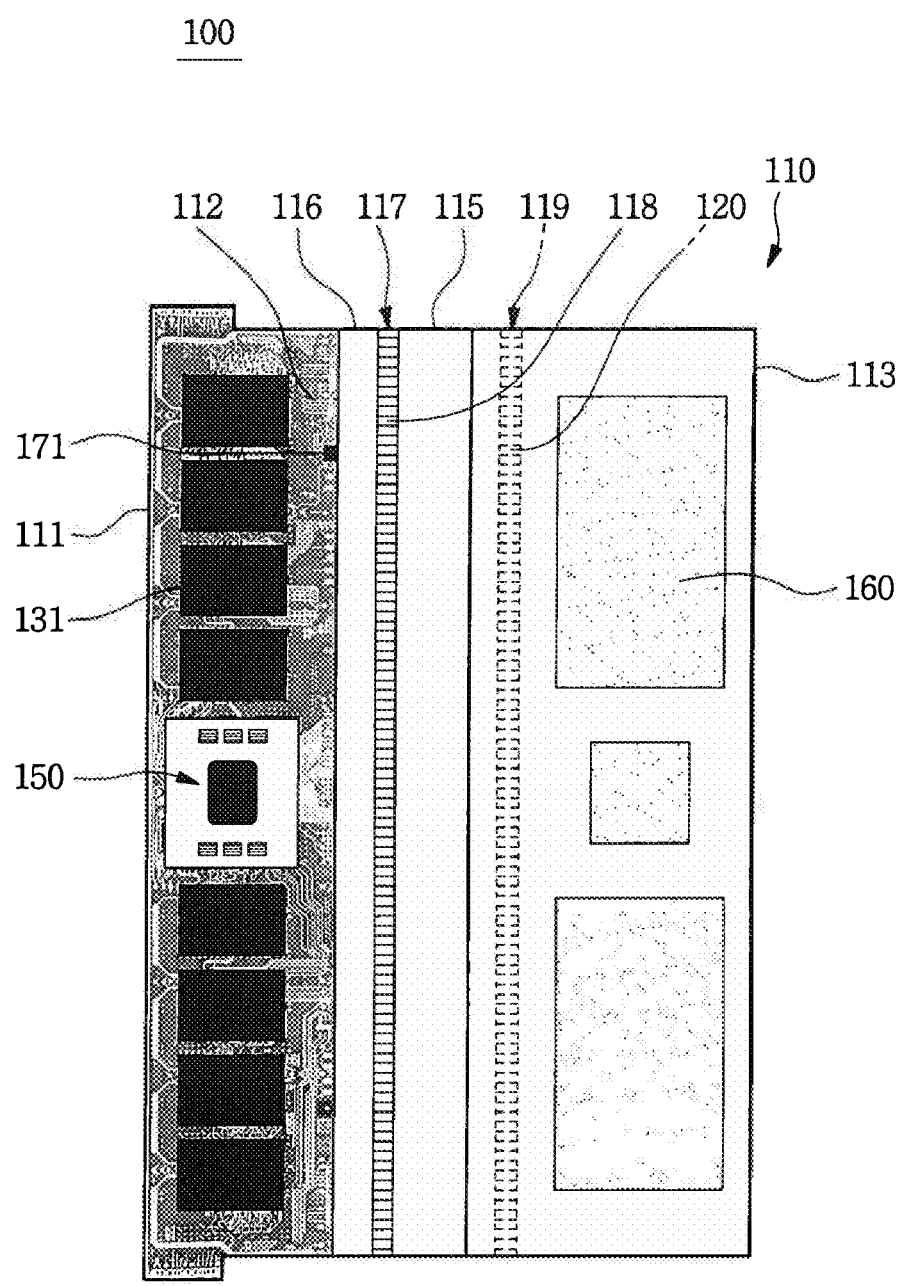
FIG. 8 is a plan view of the memory module of FIG. 7.
Figure 9:
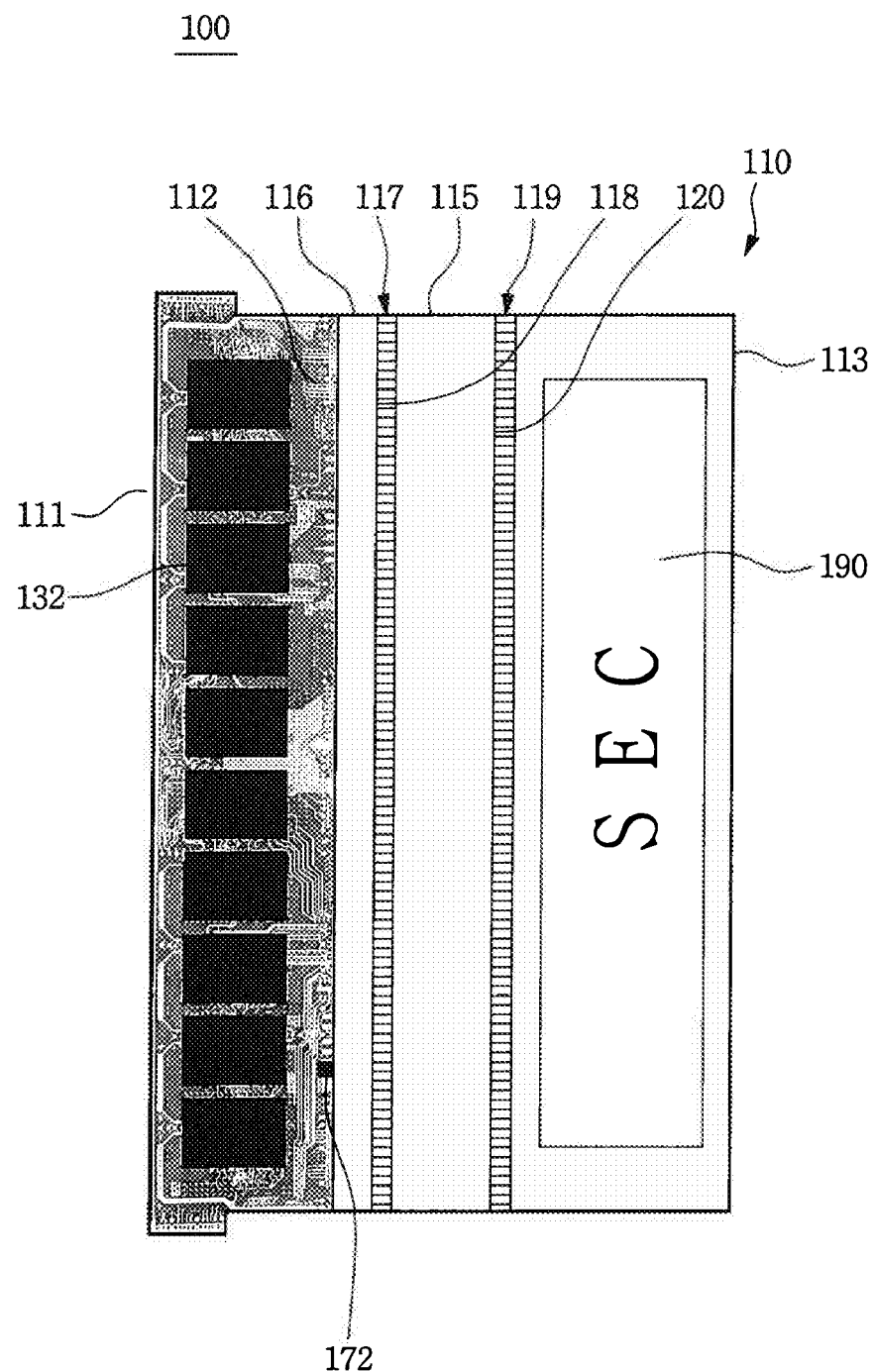
FIG. 9 is a bottom view of the memory module of FIG. 7.

FIG. 7 is a side view of a memory module in accordance with a first exemplary embodiment of the present invention, FIG. 8 is a plan view of the memory module of FIG. 7, and FIG. 9 is a bottom view of the memory module of FIG. 7.

Referring to FIGS. 7 to 9, a memory module 100 in accordance with a first exemplary embodiment of the present invention may include a printed circuit board 110, a plurality of first and second semiconductor packages 131 and 132 mounted on the printed circuit board 110, an AMB 150 mounted on the printed circuit board 110 and transmitting signals from the exterior to the first and second semiconductor packages 131 and 132, a thermal interface adhesive 160 for adhering the first semiconductor packages 131 and the AMB 150 to a heat sink 113 of the printed circuit board 110, and a label 190.

Specifically, the printed circuit board 110 may include an interconnection substrate 111 in which a plurality of first signal lines 112 are arranged. The printed circuit board 110 may further include a heat sink 113 disposed adjacent to a first surface of the interconnection substrate 111, in which no signal lines are arranged, and formed of a metal layer or plated with a metal material. The printed circuit board 110 may further include a first bending substrate 115 coupling the interconnection substrate 111 to the heat sink 113 and formed on a flexible material to be bent. The printed circuit board 110 may also include a first tab terminal 117 disposed between the interconnection substrate 111 and the first bending substrate 115 to couple the interconnection substrate 111 to the first bending substrate 115, having second signal lines 118 coupled to the first signal lines 112 to transmit signals from the exterior to the AMB 150, and adhered along one side of the first surface of the heat sink 113. The printed circuit board 110 may further include a second tab terminal 119 disposed between the heat sink 113 and the first bending substrate 115 to couple the heat sink 113 to the first bending substrate 115, having third signal lines 120 coupled to the first signal lines 112 to transmit signals from the exterior to the AMB 150, and adhered to one side of a second surface of the heat sink 113 to correspond to the first tab terminal 117. The printed circuit board 110 may also include a second bending substrate 116 disposed between the interconnection substrate 111 and the first tab terminal 117 to couple the interconnection substrate 111 to the first tab terminal 117. The various parts of the printed circuit board 110 may be integrally formed with each other.

The first semiconductor packages 131 are mounted in parallel on a first surface of the interconnection substrate 111 opposite to the heat sink 113 to be electrically coupled to the first signal lines 112. The first semiconductor packages 131 may be a DRAM package.

The second semiconductor packages 132 are mounted in parallel on a second surface of the interconnection substrate 111 opposite to the first surface of the interconnection substrate 111 to be electrically coupled to the first signal lines 112. The second semiconductor packages 132 may also be a DRAM package.

The AMB 150 is mounted on a first surface of the interconnection substrate 111 to be electrically coupled to the first signal lines 112 to transmit signals from the exterior to the first and second semiconductor packages 131 and 132. The AMB 150 may be mounted on a center portion of the first surface of the interconnection substrate 111.

The thermal interface adhesive 160 may be coated on a first surface of the heat sink 113 to adhere the first semiconductor packages 131 and the AMB 150 mounted on the first surface of the interconnection substrate 111 to the heat sink 113 of the printed circuit board 110 disposed adjacent to the first surface of the interconnection substrate 111. Therefore, the first semiconductor packages 131 and the AMB 150 mounted on the first surface of the interconnection substrate 111 are adhered to the heat sink 113 by the thermal interface adhesive 160. At this time, the thermal interface adhesive 160 also functions to transmit heat of the first semiconductor packages 131 and the AMB 150 toward the heat sink 113. Therefore, the heat of the first semiconductor packages 131 and the AMB 150 is transmitted toward the heat sink 113, and the transmitted heat is discharged through the heat sink 113.

The label 190 may be attached to a second surface of the heat sink 113, on which no thermal interface adhesive 160 is coated. At this time, the label 190 may be marked with a capacity or a manufacturer of the memory module 100.

Meanwhile, a plurality of passive devices 171 and 172 may be further mounted on the interconnection substrate 111. For example, the first passive devices 171 may be mounted on the first surface of the interconnection substrate 111, and the second passive devices 172 may be mounted on the second surface of the interconnection substrate 111. Here, the passive devices 171 and 172 may be inductors L, capacitors C, and resistors R, in order to improve signal transmission quality of the semiconductor packages 131 and 132.

Second Embodiment of Memory Module

Figure 10:
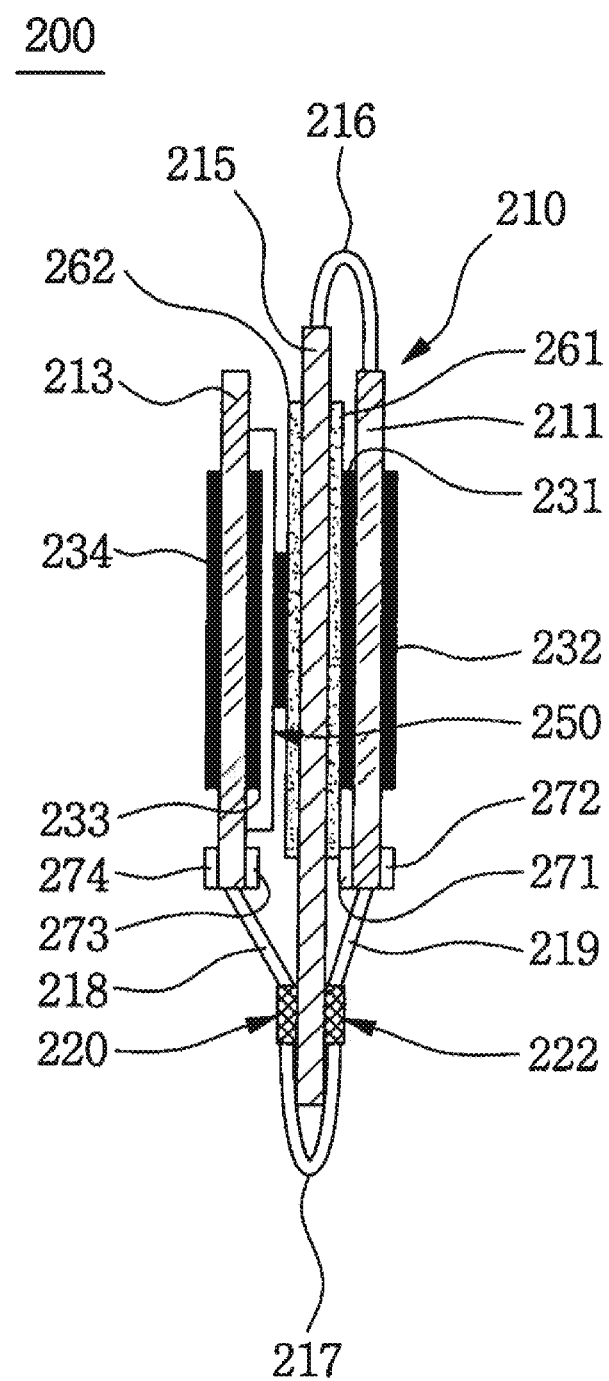
FIG. 10 is a side view of a memory module in accordance with a second exemplary embodiment of the present invention.
Figure 11:
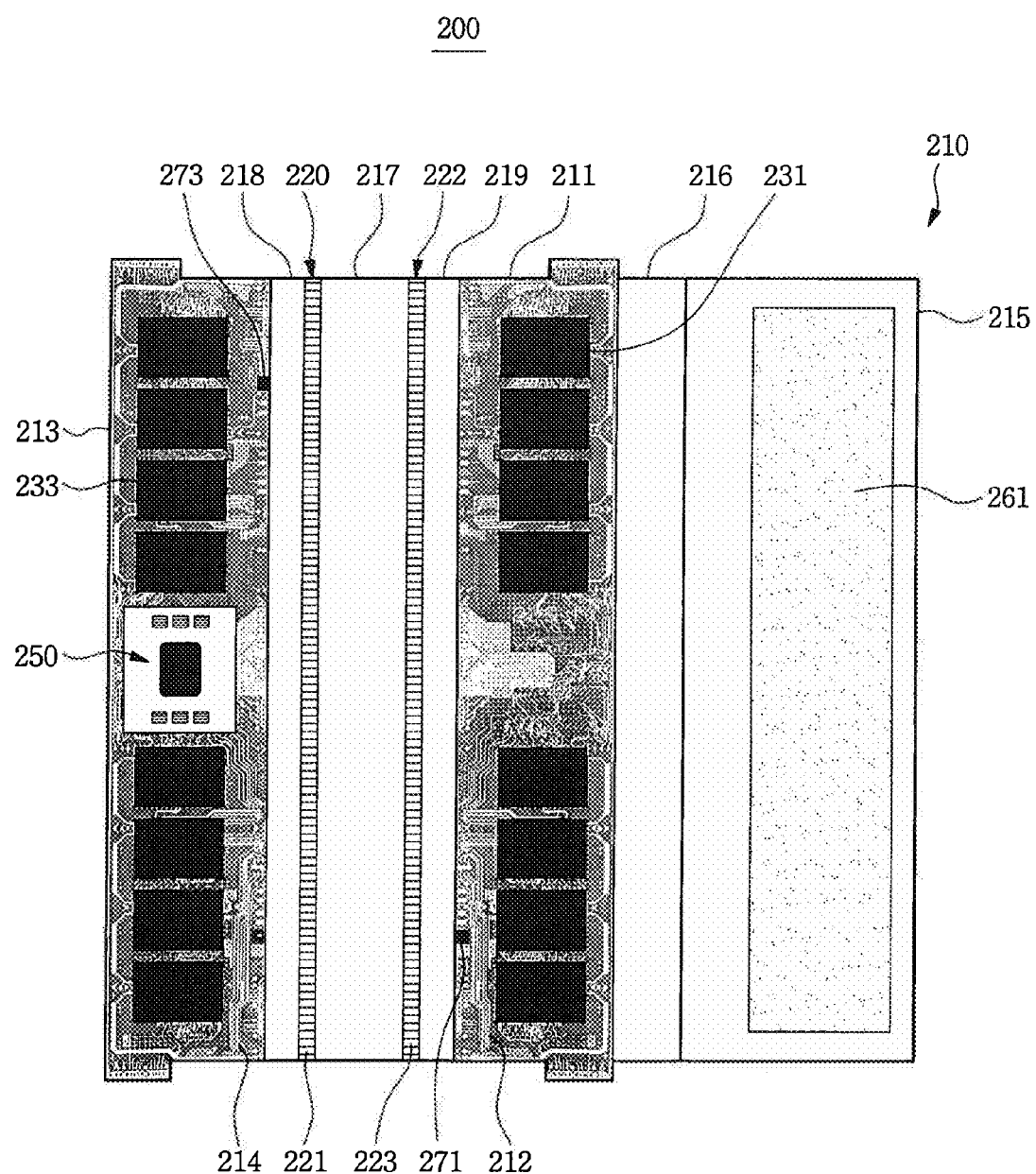
FIG. 11 is a plan view of the memory module of FIG. 10.
Figure 12:
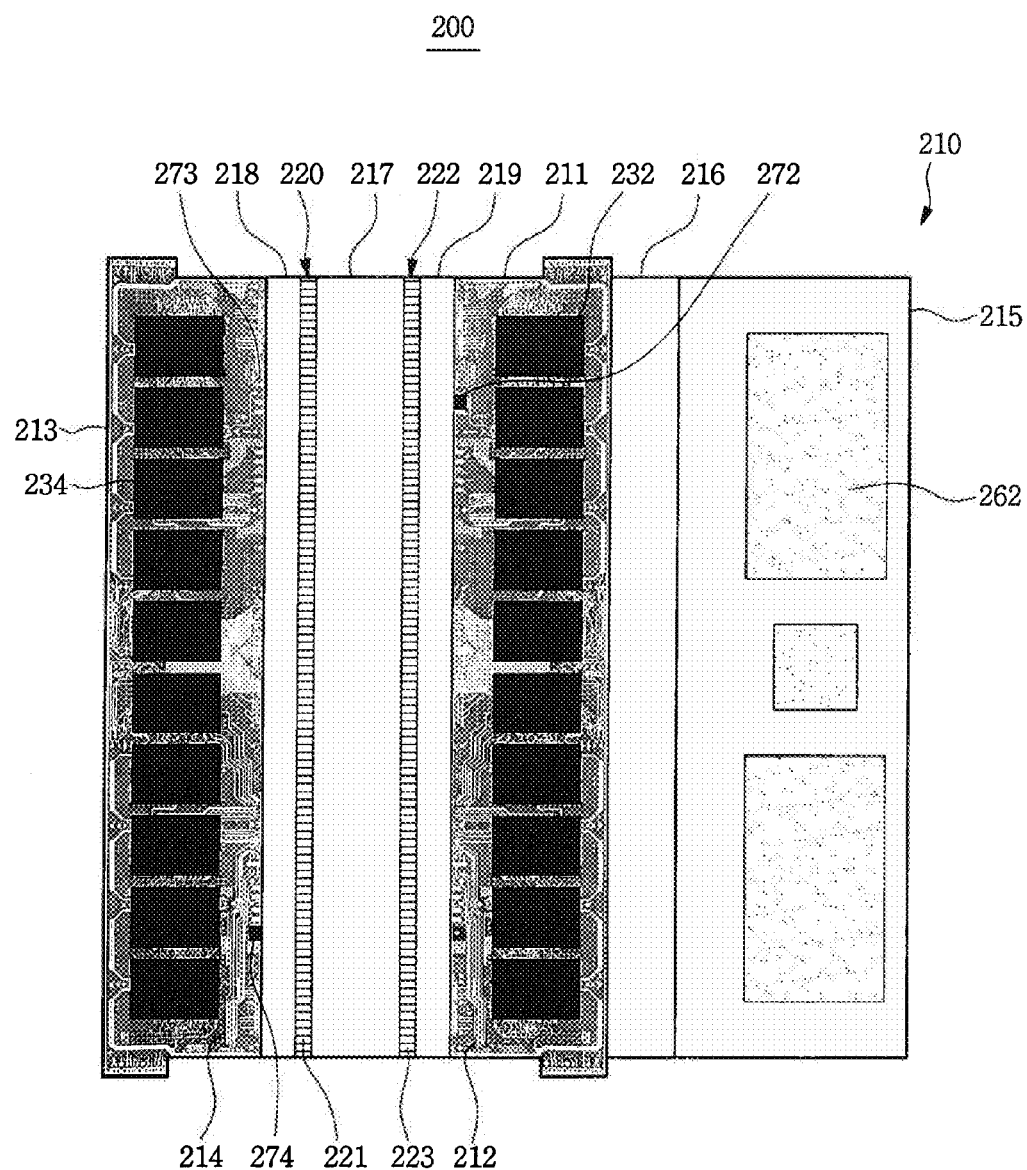
FIG. 12 is a bottom view of the memory module of FIG. 10.

FIG. 10 is a side view of a memory module in accordance with a second exemplary embodiment of the present invention, FIG. 11 is a plan view of the memory module of FIG. 10, and FIG. 12 is a bottom view of the memory module of FIG. 10.

Referring to FIGS. 10 to 12, a memory module 200 in accordance with a second exemplary embodiment of the present invention may include a printed circuit board 210, a plurality of first, second, third, and fourth semiconductor packages 231, 232, 233, and 234 mounted on the printed circuit board 210, an AMB 250 mounted on the printed circuit board 210 and transmitting signals from the exterior to the first, second, third, and fourth semiconductor packages 231, 232, 233 and 234, a first thermal interface adhesive 261 for adhering the first semiconductor packages 231 to a first surface of a heat sink 215, and a second thermal interface adhesive 262 for adhering the third semiconductor packages 233 and the AMB 250 to a second surface of the heat sink 215.

Specifically, the printed circuit board 210 may include a first interconnection substrate 211, a second interconnection substrate 213, a heat sink 215, a first bending substrate 216, a second bending substrate 217, a third bending substrate 218, a fourth bending substrate 219, a first tab terminal 220, and a second tab terminal 222.

A plurality of first signal lines 212 are arranged in the first interconnection substrate 211 to be electrically coupled to the first and second semiconductor packages 231 and 232. The heat sink 215 has no signal lines arranged therein, and is disposed adjacent to a first surface of the first interconnection substrate 211. The heat sink 215 may be formed of a metal material or plated with a metal material.

The second interconnection substrate 213 is disposed adjacent to a second surface of the heat sink 215 opposite to the first surface of the heat sink 215, and a plurality of second signal lines 214 are arranged in the second interconnection substrate 213 to be electrically coupled to the third and fourth semiconductor packages 233 and 234.

The first bending substrate 216 couples the first interconnection substrate 211 to the heat sink 215 and is formed of a flexible material to be bent. In addition, the second bending substrate 217 couples the second interconnection substrate 213 to the first interconnection substrate 211 and is formed of a flexible material to be bent.

The first tab terminal 220 is disposed between the second interconnection substrate 213 and the second bending substrate 217 to couple the second interconnection substrate 213 to the second bending substrate 217, has third signal lines 221 coupled to the first and second signal lines 212 and 214 to transmit signals from the exterior to the AMB 250, and is adhered along one side of a second surface of the heat sink 215.

The second tab terminal 222 is disposed between the first interconnection substrate 211 and the second bending substrate 217 to couple the first interconnection substrate 211 to the second bending substrate 217, has fourth signal lines 223 coupled to the first and second signal lines 212 and 214 to transmit signals from the exterior to the AMB 250, and is adhered along one side of a first surface of the heat sink 215 to correspond to the first tab terminal 220.

The third bending substrate 218 is disposed between the second interconnection substrate 213 and the first tab terminal 220 to couple the second interconnection substrate 213 to the first tab terminal 220, and is formed of a flexible material to be bent. In addition, the fourth bending substrate 219 is disposed between the first interconnection substrate 211 and the second tab terminal 222 to couple the first interconnection substrate 211 to the second tab terminal 222, and is formed of a flexible material to be bent.

Meanwhile, the first semiconductor packages 231 are mounted in parallel on a first surface of the first interconnection substrate 211 opposite to the heat sink 215 to be electrically coupled to the first signal lines 212. The first semiconductor packages 231 may be a DRAM package.

The second semiconductor packages 232 are mounted in parallel on a second surface of the first interconnection substrate 211 opposite to the first surface of the first interconnection substrate 211 to be electrically coupled to the first signal lines 212. The second semiconductor packages 231 may also be a DRAM package.

The third semiconductor packages 233 are mounted in parallel on a first surface of the second interconnection substrate 213 opposite to the heat sink 215 to be electrically coupled to the second signal lines 214. The third semiconductor packages 233 may also be a DRAM package.

The fourth semiconductor packages 234 are mounted in parallel on a second surface of the second interconnection substrate 213 opposite to the first surface of the second interconnection substrate 213 to be electrically coupled to the second signal lines 214. The fourth semiconductor packages 234 may also be a DRAM package.

The AMB 250 is mounted on the first surface of the second interconnection substrate 213 to be electrically coupled to the first and second signal lines 212 and 214 to transmit signals from the exterior to the first, second, third, and fourth semiconductor packages 231, 232, 233, and 234. The AMB 250 may be mounted on a center portion of the first surface of the second interconnection substrate 213.

The first thermal interface adhesive 261 may be coated on the first surface of the heat sink 215 to adhere the first semiconductor packages 231 mounted on the first surface of the first interconnection substrate 211 to the heat sink 215 disposed adjacent to the first surface of the first interconnection substrate 211. Therefore, the first semiconductor packages 231 mounted on the first surface of the first interconnection substrate 211 are adhered to the heat sink 215 by the first thermal interface adhesive 261. At this time, the first thermal interface adhesive 261 may function to transmit heat of the first semiconductor packages 231 toward the heat sink 215. Therefore, the heat of the first semiconductor packages 231 is transmitted toward the heat sink 215, and the transmitted heat is discharged to the exterior through the heat sink 215.

The second thermal interface adhesive 262 may be coated on a second surface of the heat sink 215 to adhere the third semiconductor packages 233 and the AMB 250 mounted on the first surface of the second interconnection substrate 213 to the second surface of the heat sink 215 opposite to the third semiconductor packages 233. Therefore, the third semiconductor packages 233 and the AMB 250 mounted on the first surface of the second interconnection substrate 213 are adhered to the heat sink 215 by the second thermal interface adhesive 262. At this time, the second thermal interface adhesive 262 may function to transmit heat of the third semiconductor packages 233 and the AMB 250 toward the heat sink 215. Therefore, the heat of the third semiconductor packages 233 and the AMB 250 is transmitted toward the heat sink 215, and the transmitted heat is discharged to the exterior through the heat sink 215.

Meanwhile, a plurality of passive devices 271, 272, 273 and 274 may be further mounted on the interconnection substrates 211 and 213. For example, the first passive devices 271 may be mounted on the first surface of the first interconnection substrate 211, and the second passive devices 272 may be mounted on the second surface of the first interconnection substrate 211. In addition, the third passive devices 273 may be mounted on the first surface of the second interconnection substrate 213, and the fourth passive devices 274 may be mounted on the second surface of the second interconnection substrate 213. Here, the passive devices 271, 272, 273 and 274 may be inductors L, capacitors C, and resistors R, in order to improve signal transmission quality of the semiconductor packages 231, 232, 233 and 234.

Third Embodiment of Memory Module

Figure 13:
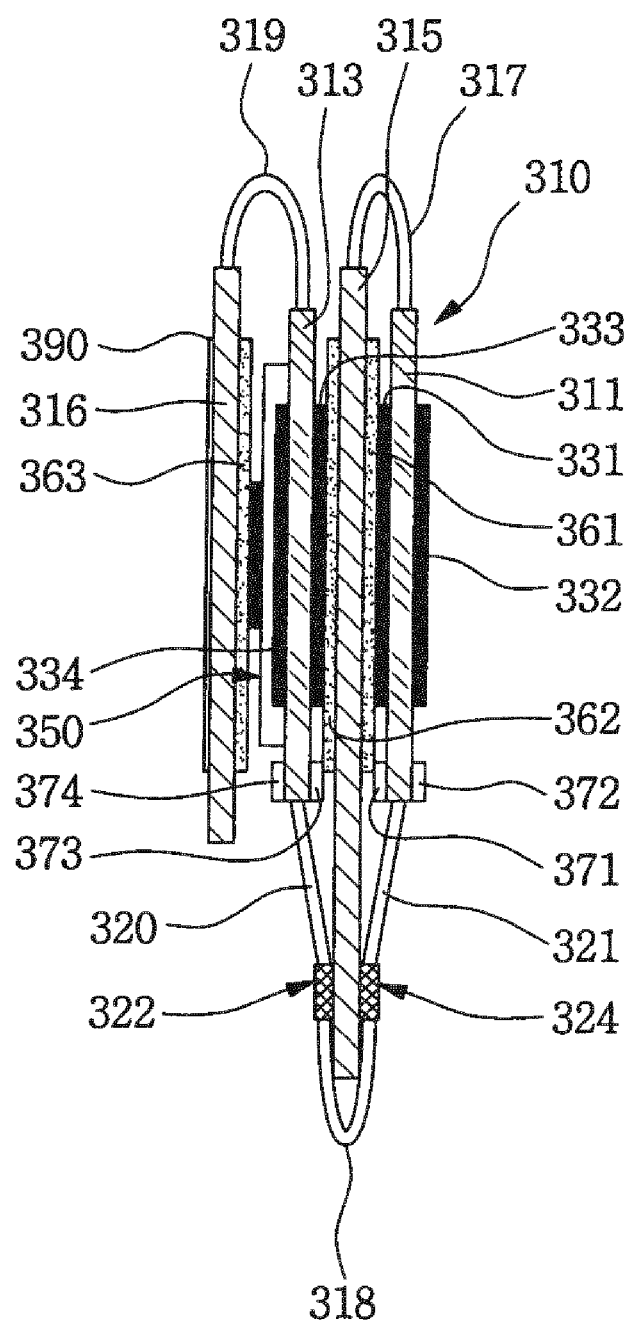
FIG. 13 is a side view of a memory module in accordance with a third exemplary embodiment of the present invention.
Figure 14:
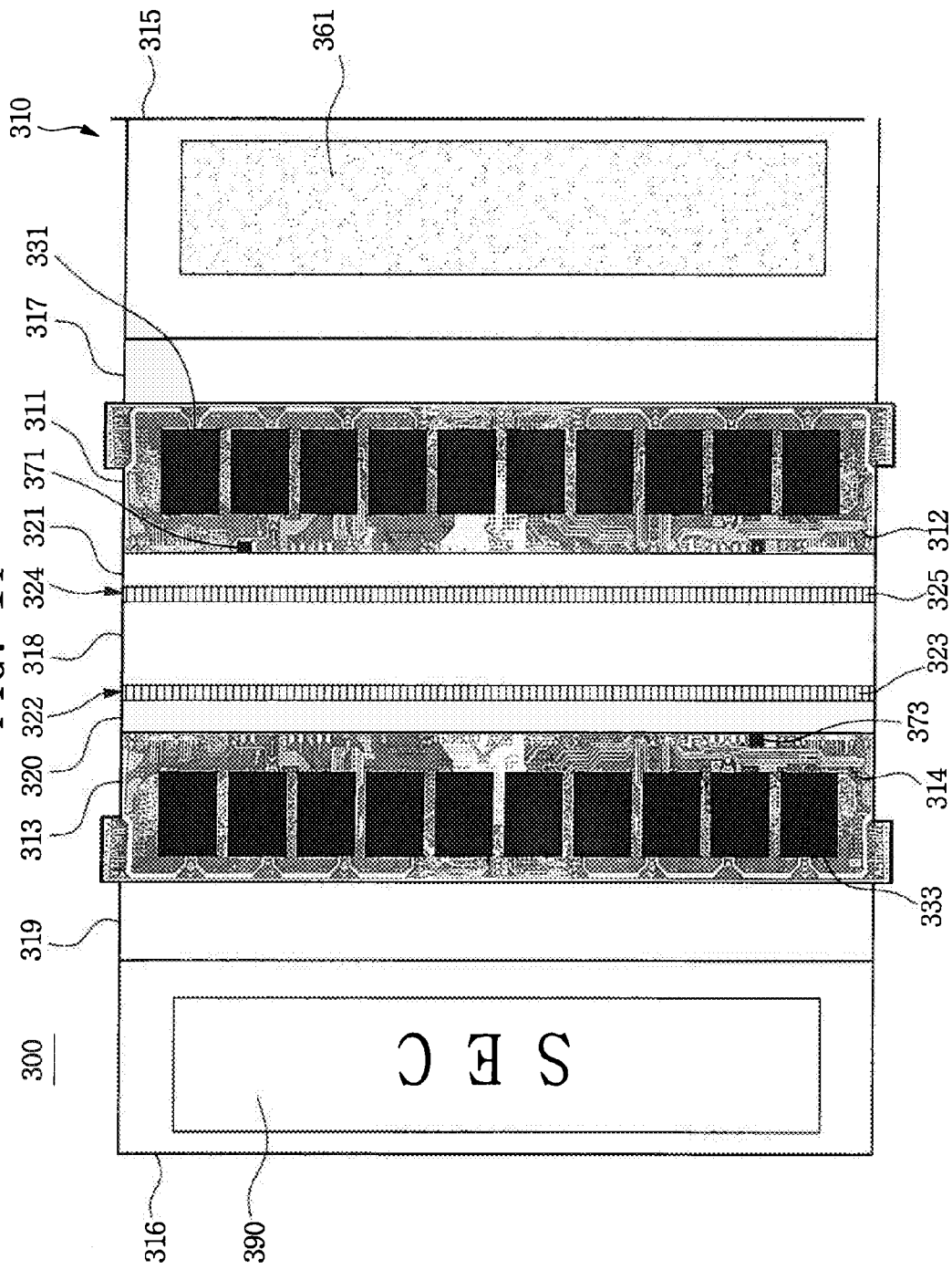
FIG. 14 is a plan view of the memory module of FIG. 13.
Figure 15:
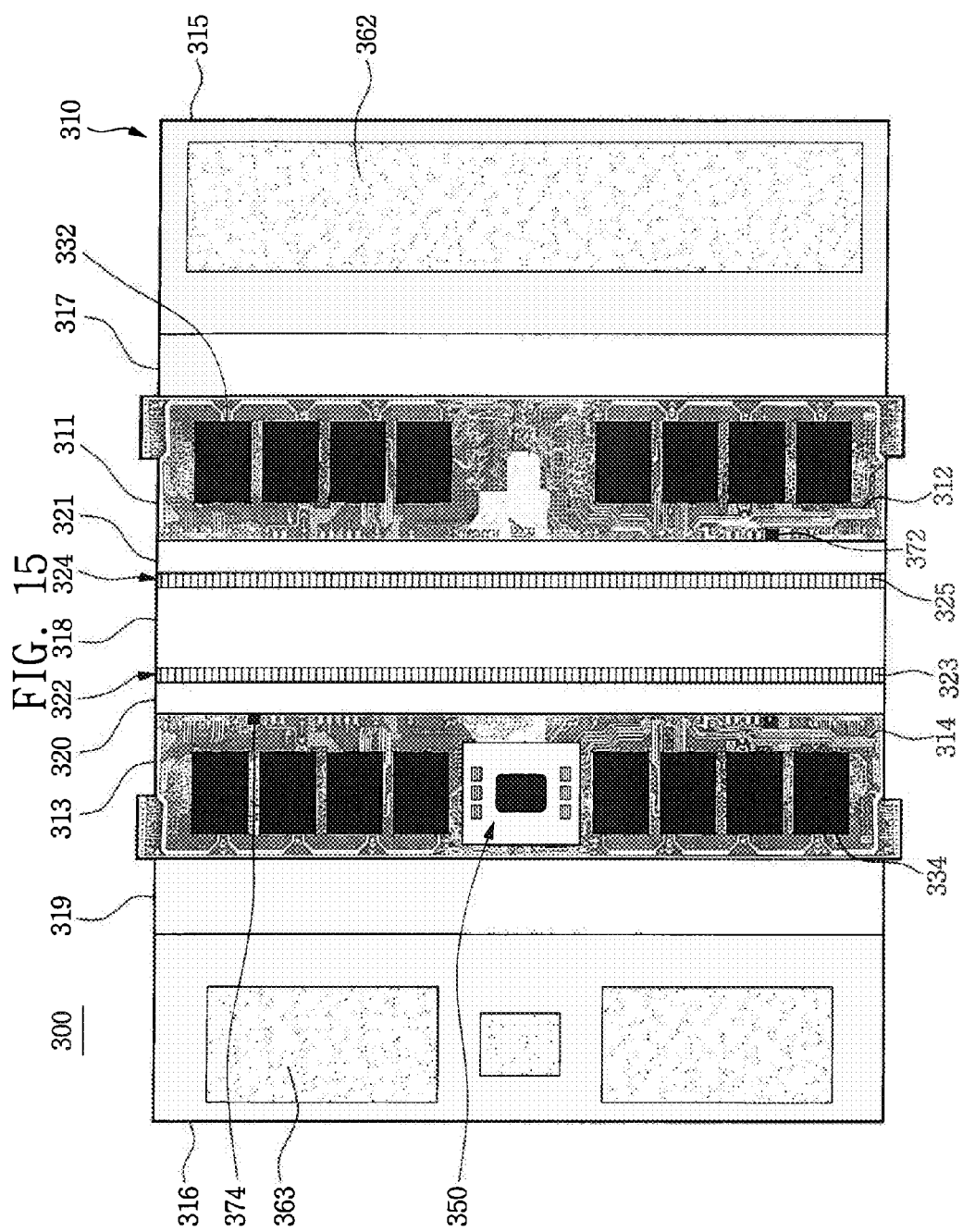
FIG. 15 is a bottom view of the memory module of FIG. 13.

FIG. 13 is a side view of a memory module in accordance with a third exemplary embodiment of the present invention, FIG. 14 is a plan view of the memory module of FIG. 13, and FIG. 15 is a bottom view of the memory module of FIG. 13.

Referring to FIGS. 13 to 15, a memory module 300 in accordance with a third exemplary embodiment of the present invention may include a printed circuit board 310, a plurality of first, second, third, and fourth semiconductor packages 331, 332, 333 and 334 mounted on the printed circuit board 310, an AMB 350 mounted on the printed circuit board 310 and transmitting signals from the exterior to the first, second, third, and fourth semiconductor packages 331, 332, 333 and 334, a first thermal interface adhesive 361 for adhering the first semiconductor packages 331 to a first surface of a first heat sink 315, a second thermal interface adhesive 362 for adhering the third semiconductor packages 333 to a second surface of the first heat sink 315, a third thermal interface adhesive 363 for adhering the fourth semiconductor packages 334 and the AMB 350 to a first surface of a second heat sink 316, and a label 390.

Specifically, the printed circuit board 310 may include a first interconnection substrate 311, a second interconnection substrate 313, a first heat sink 315, a second heat sink 316, a first bending substrate 317, a second bending substrate 318, a third bending substrate 319, a fourth bending substrate 320, a fifth bending substrate 321, a first tab terminal 322, and a second tab terminal 324.

A plurality of first signal lines 312 are arranged in the first interconnection substrate 311 to be electrically coupled to the first and second semiconductor packages 331 and 332.

The first heat sink 315 has no signal lines arranged therein, and is disposed adjacent to a first surface of the first interconnection substrate 311. The first heat sink 315 may be formed of a metal material or plated with a metal material.

The second interconnection substrate 313 is disposed adjacent to a second surface of the first heat sink 315 opposite to the first surface of the first heat sink 315, and a plurality of signal lines 314 are arranged in the second interconnection substrate 313 to be electrically coupled to the third and fourth semiconductor packages 333 and 334.

The second heat sink 316 has no signal lines arranged therein, and is disposed adjacent to a second surface of the second interconnection substrate 313 opposite to the first surface of the second interconnection substrate 313. The second heat sink 316 may be formed of a metal material or plated with a metal material.

The first bending substrate 317 couples the first interconnection substrate 311 to the first heat sink 315, and is formed of a flexible material to be bent. In addition, the second bending substrate 318 couples the second interconnection substrate 313 to the first interconnection substrate 311, and is formed of a flexible material to be bent. Further, the third bending substrate 319 couples the second interconnection substrate 313 to the second heat sink 316, and is formed of a flexible material to be bent.

The first tab terminal 322 is disposed between the second interconnection substrate 313 and the second bending substrate 318 to couple the second interconnection substrate 313 to the second bending substrate 318, has third signal lines 323 coupled to the first and second signal lines 312 and 314 to transmit signals from the exterior to the AMB 350, and is adhered along one side of the second surface of the first heat sink 315.

The second tab terminal 324 is disposed between the first interconnection substrate 311 and the second bending substrate 318 to couple the first interconnection substrate 311 to the second bending substrate 318, has fourth signal lines 325 coupled to the first and second signal lines 312 and 314 to transmit signals from the exterior to the AMB 350, and is adhered along one side of the first surface of the first heat sink 315 to correspond to the first tab terminal 322.

The fourth bending substrate 320 is disposed between the second interconnection substrate 313 and the first tab terminal 322 to couple the second interconnection substrate 313 to the first tab terminal 322, and is formed of a flexible material to be bent. In addition, the fifth bending substrate 321 is disposed between the first interconnection substrate 311 and the second tab terminal 324 to couple the first interconnection substrate 311 to the second tab terminal 324, and is formed of a flexible material to be bent.

Meanwhile, the first semiconductor packages 331 are mounted in parallel on a first surface of the first interconnection substrate 311 opposite to the first heat sink 315 to be electrically coupled to the first signal lines 312. The first semiconductor packages 331 may be a DRAM package.

The second semiconductor packages 332 are mounted in parallel on a second surface of the first interconnection substrate 311 opposite to the first surface of the first interconnection substrate 311 to be electrically coupled to the first signal lines 312. The second semiconductor packages 332 may also be a DRAM package.

The third semiconductor packages 333 are mounted in parallel on a first surface of the second interconnection substrate 313 opposite to the first heat sink 315 to be electrically coupled to the second signal lines 314. The third semiconductor packages 333 may also be a DRAM package.

The fourth semiconductor packages 334 are mounted in parallel on a second surface of the second interconnection substrate 313 opposite to the first surface of the second interconnection substrate 313 to be electrically coupled to the second signal lines 314. The fourth semiconductor packages 334 may also be a DRAM package.

The AMB 350 are mounted on the second surface of the second interconnection substrate 313 to be electrically coupled to the first and second signal lines 312 and 314 to transmit signals from the exterior to the first, second, third, and fourth semiconductor packages 331, 332, 333 and 334. The AMB 350 may be mounted on a center portion of the second surface of the second interconnection substrate 313.

The first thermal interface adhesive 361 may be coated on a first surface of the first heat sink 315 to adhere the first semiconductor packages 331 mounted on the first surface of the first interconnection substrate 311 to the first heat sink 315 disposed adjacent to the first surface of the first interconnection substrate 311. Therefore, the first semiconductor packages 331 mounted on the first surface of the first interconnection substrate 311 are adhered to the first heat sink 315 by the first thermal interface adhesive 361. At this time, the first thermal interface adhesive 361 also functions to transmit heat of the first semiconductor packages 331 toward the first heat sink 315. Therefore, the heat of the first semiconductor packages 331 is transmitted toward the first heat sink 315, and the transmitted heat is discharged to the exterior through the first heat sink 315.

The second thermal interface adhesive 362 may be coated on a second surface of the first heat sink 315 to adhere the third semiconductor packages 333 mounted on the first surface of the second interconnection substrate 313 to the second surface of the first heat sink 315 opposite to the third semiconductor packages 333. Therefore, the third semiconductor packages 333 mounted on the first surface of the second interconnection substrate 313 are adhered to the first heat sink 315 by the second thermal interface adhesive 362. At this time, the second thermal interface adhesive 362 also functions to transmit heat of the third semiconductor packages 333 toward the first heat sink 315. Therefore, the heat of the third semiconductor packages 333 is transmitted toward the first heat sink 315, and the transmitted heat is discharged to the exterior through the first heat sink 315.

The third thermal interface adhesive 363 may be coated on a first surface of the second heat sink 316 to adhere the fourth semiconductor packages 334 and the AMB 350 mounted on the second surface of the second interconnection substrate 313 to the first surface of the second heat sink 316 opposite to the fourth semiconductor packages 334. Therefore, the fourth semiconductor packages 334 and the AMB 350 mounted on the second surface of the second interconnection substrate 313 are adhered to the second heat sink 316 by the third thermal interface adhesive 363. At this time, the third thermal interface adhesive 363 also functions to transmit heat of the fourth semiconductor packages 334 and the AMB 350 toward the second heat sink 316. Therefore, the heat of the fourth semiconductor packages 334 and the AMB 350 is transmitted toward the second heat sink 316, and the transmitted heat is discharged to the exterior through the second heat sink 316.

The label 390 may be attached to the second surface of the heat sink 316, on which the thermal interface adhesive is not coated. At this time, the label 390 may be marked with a capacity or a manufacturer of the memory module 300.

Meanwhile, a plurality of passive devices 371, 372, 373 and 374 may be further mounted on the interconnection substrates 311 and 313. For example, the first passive devices 371 may be mounted on the first surface of the first interconnection substrate 311, and the second passive devices 372 may be mounted on the second surface of the first interconnection substrate 311. In addition, the third passive devices 373 may be mounted on the first surface of the second interconnection substrate 313, and the fourth passive devices 374 may be mounted on the second surface of the second interconnection substrate 313. Here, the passive devices 371, 372, 373 and 374 function to improve signal transmission quality of the semiconductor packages 331, 332, 333 and 334, and may be inductors L, capacitors C, and resistors R.

First Embodiment of Method of Fabricating Memory Module

Figure 16:
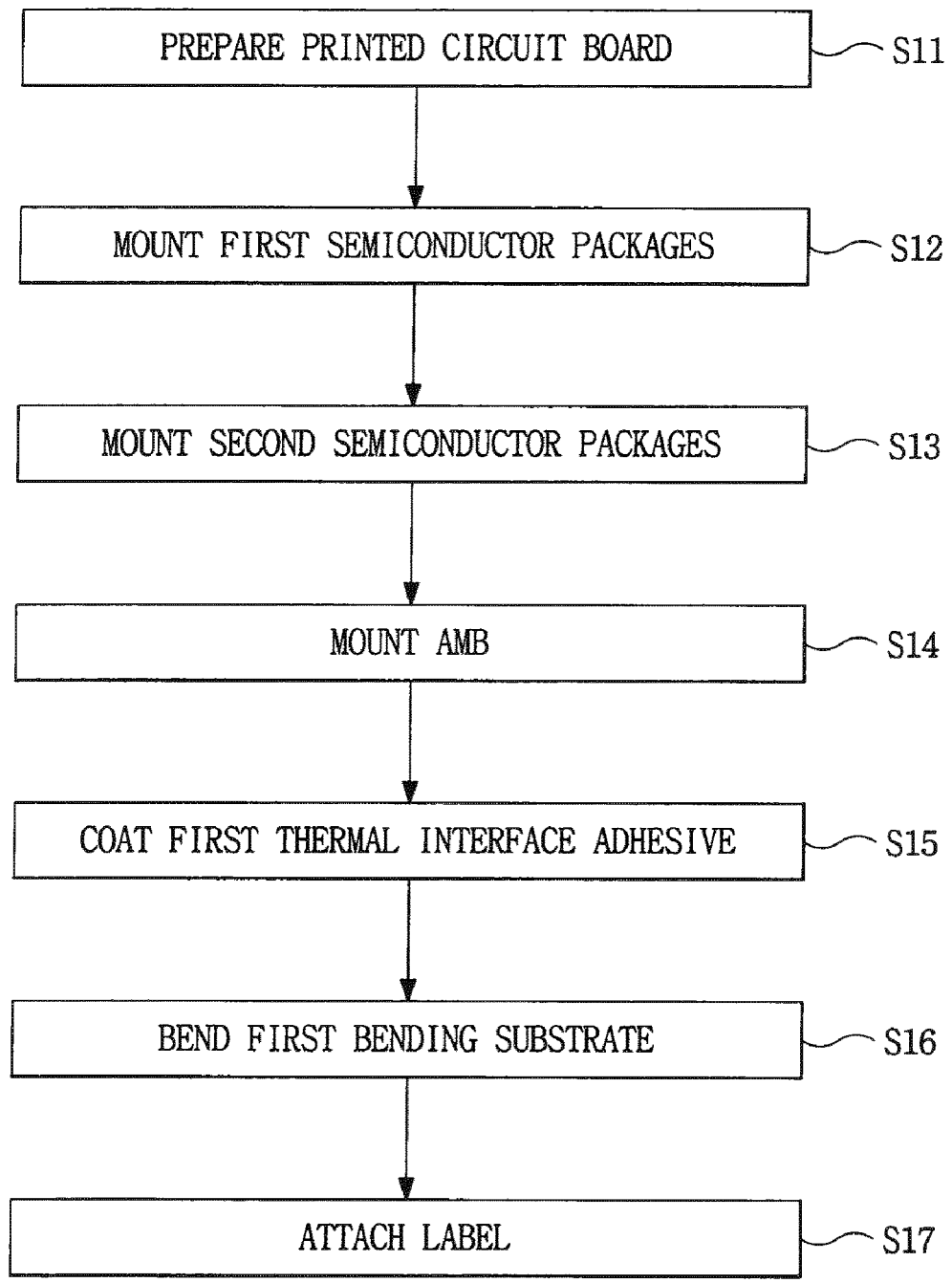
FIG. 16 is a flowchart showing a method of fabricating a memory module in accordance with a first exemplary embodiment of the present invention.

FIG. 16 is a flowchart showing a method of fabricating a memory module in accordance with a first exemplary embodiment of the present invention.

First, a printed circuit board 110 is prepared (S11) including an interconnection substrate 111 in which a plurality of first signal lines 112 are arranged, a heat sink 113 disposed on one surface of the interconnection substrate 111 and in which no signal lines are arranged, and a first bending substrate 115 coupling the interconnection substrate 111 to the heat sink 113 and formed of a flexible material to be bent.

Then, when the printed circuit board 110 is prepared, a plurality of first semiconductor packages 131 and first passive devices 171 are mounted on an upper surface of the interconnection substrate 111 to be electrically coupled to first signal lines 112 (S12). A plurality of second semiconductor packages 132 and second passive signal lines 112 are mounted on a lower surface of the interconnection substrate 111 to be electrically coupled to the first signal lines 112 (S13). Then, an AMB 150 is mounted on the upper surface of the interconnection substrate 111 to be electrically coupled to the first signal lines 112 to transmit signals from the exterior to the first and second semiconductor packages 131 and 132 (S14).

When the semiconductor packages 131 and 132 and the AMB 150 are mounted, a thermal interface adhesive 160 may be coated on an upper surface of the heat sink 113 to adhere the first semiconductor packages 131 and the AMB 150 thereto (S15).

Then, when the thermal interface adhesive 160 is coated, the first bending substrate 115 is bent to adhere the first semiconductor packages 131 and the AMB 150 to an upper surface of the heat sink 113 by the thermal interface adhesive 160 (S16). Therefore, the first semiconductor packages 131 and the AMB 150 are adhered to the upper surface of the heat sink 113 by the thermal interface adhesive 160.

Next, when the first semiconductor packages 131 and the AMB 150 are attached to the upper surface of the heat sink 113, an operator may attach a label to a lower surface of the heat sink 113 (S17). Therefore, the method of fabricating a memory module 100 in accordance with a first exemplary embodiment of the present invention is completed.

Meanwhile, in addition to the interconnection substrate 111, the heat sink 113, and the first bending substrate 115, other configurations are possible. For example, when the printed circuit board 110 prepared to manufacture the memory module 100 further includes a first tab terminal 117 coupling the interconnection substrate 111 to the first bending substrate 115 and having second signal lines 118 coupled to the first signal lines 112 to transmit signals from the exterior to the AMB 150, a second tab terminal 119 disposed between the heat sink 113 and the first bending substrate 115 to couple the heat sink 113 to the first bending substrate 115 and having third signal lines 120 coupled to the first signal lines 112 to transmit signals from the exterior to the AMB 150, and a second bending substrate 116 disposed between the interconnection substrate 115 and the first tab terminal 117 to couple the interconnection substrate 115 to the first tab terminal 117, an operator can adhere the first tab terminal 117 along one side of the upper surface of the heat sink 113 and adhere the second tab terminal 119 along one side of a lower surface of the heat sink 113 to correspond to the first tab terminal 117 using an adhesive (not shown). The operator may adhere the first and second tab terminals before bending the first bending substrate 115.

Second Embodiment of Method of Fabricating Memory Module

Figure 17:
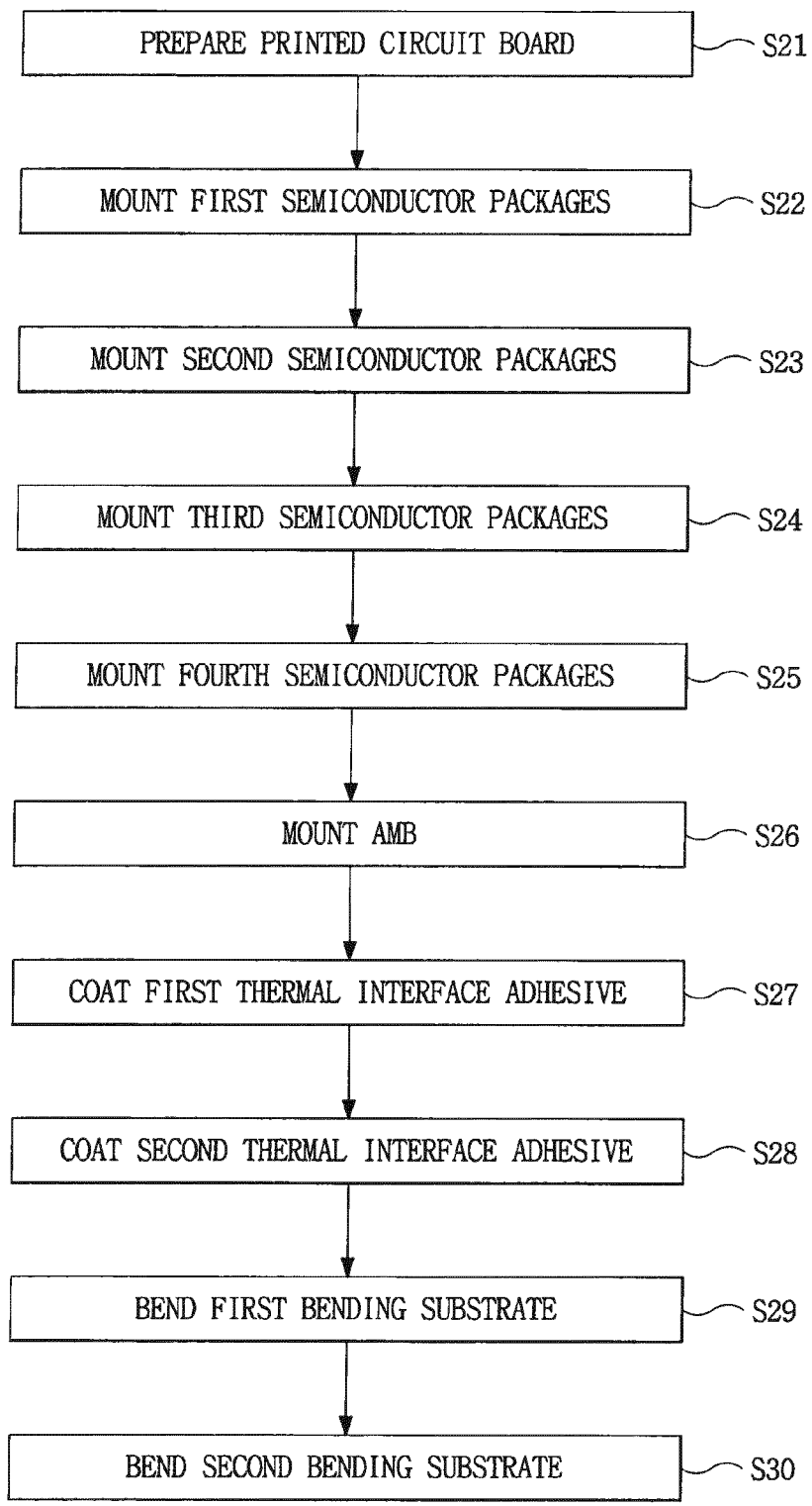
FIG. 17 is a flowchart showing a method of fabricating a memory module in accordance with a second exemplary embodiment of the present invention.

FIG. 17 is a flowchart showing a method of fabricating a memory module in accordance with a second exemplary embodiment of the present invention.

First, a printed circuit board 210 is prepared (S21) including a first interconnection substrate 211 in which a plurality of first signal lines 212 are arranged, a heat sink 215 disposed on one surface of the first interconnection substrate 211 and in which no signal lines are arranged, a first bending substrate 216 coupling the first interconnection substrate 211 to the heat sink 215 and formed of a flexible material to be bent, a second interconnection substrate 213 disposed on the other surface of the first interconnection substrate 211 and in which second signal lines 214 are arranged, and a second bending substrate 217 coupling the second interconnection substrate 213 to the first interconnection substrate 211 and formed of a flexible material to be bent.

Then, when the printed circuit board 210 is prepared, a plurality of first semiconductor packages 231 and first passive devices 271 are mounted on an upper surface of the first interconnection substrate 211 to be electrically coupled to the first signal lines 212 (S22), and a plurality of second semiconductor packages 232 and second passive devices 272 are mounted on an upper surface of the second interconnection substrate 213 to be electrically coupled to the second signal lines 213 (S23). In addition, a plurality of third semiconductor packages 233 and third passive devices 273 are mounted on a lower surface of the first interconnection substrate 211 to be electrically coupled to the first signal lines 212 (S24), and a plurality of fourth semiconductor packages 244 and fourth passive devices 274 are mounted on a lower surface of the second interconnection substrate 213 to be electrically coupled to the second signal lines 214 (S25). Further, an AMB 250 is mounted on the upper surface of the second interconnection substrate 213 to be electrically coupled to the first and second signal lines 211 and 213 to transmit signals from the exterior to the first, second, third, and fourth semiconductor packages 231, 232, 233 and 234 (S26).

When the semiconductor packages 231, 232, 233 and 234 and the AMB 250 are mounted, a first thermal interface adhesive 261 may be coated on an upper surface of the heat sink 215 to adhere the first semiconductor packages 231 thereto (S27), and a second thermal interface adhesive 262 may be coated on a lower surface of the heat sink 215 to adhere the second semiconductor packages 232 and the AMB 250 thereto (S28).

Then, when the thermal interface adhesives 261 and 262 are coated, the first bending substrate 317 is bent to adhere the first semiconductor packages 231 on the upper surface of the heat sink 215 by the first thermal interface adhesive 261 (S29). Therefore, the first semiconductor packages 231 are adhered to the upper surface of the heat sink 215 by the first thermal interface adhesive 261.

Next, when the first bending substrate 216 is bent, the second bending substrate 217 is bent to adhere the second semiconductor packages 232 and the AMB 250 to the lower surface of the heat sink 215 by the second thermal interface adhesive 262 (S30). Therefore, the second semiconductor packages 232 and the AMB 250 are adhered to the lower surface of the heat sink 215. Eventually, the method of fabricating a memory module in accordance with a second exemplary embodiment of the present invention is completed.

Meanwhile, in addition to the first interconnection substrate 211, the second interconnection substrate 213, the heat sink 215, the first bending substrate 216, and the second bending substrate 217, other configuration are possible. For example, when the printed circuit board 210 prepared to manufacture the memory module 200 further includes a first tab terminal 220 coupling the second interconnection substrate 213 to the second bending substrate 217 and having third signal lines 221 coupled to the first and second signal lines 212 and 214 transmit signals from the exterior to the AMB 250, a second tab terminal 222 disposed between the first interconnection substrate 211 and the second bending substrate 217 to couple the first interconnection substrate 211 to the second bending substrate 217 and having fourth signal lines 223 coupled to the first and second signal lines 212 and 214 to transmit signals from the exterior to the AMB 250, and third and fourth bending substrates 217 and 219 disposed between the tab terminals 220 and 222 and the interconnection substrates 211 and 213, an operator can adhere the first tab terminal 220 along one side of the upper surface of the heat sink 215 and adhere the second tab terminal 222 along one side of the lower surface of the heat sink 215 to correspond to the first tab terminal 220 using an adhesive (not shown). The operator may adhere the first and second tab terminals between a process of bending the first bending substrate 216 and a process of bending the second bending substrate 217.

Third Embodiment of Method of Fabricating Memory Module

Figure 18:
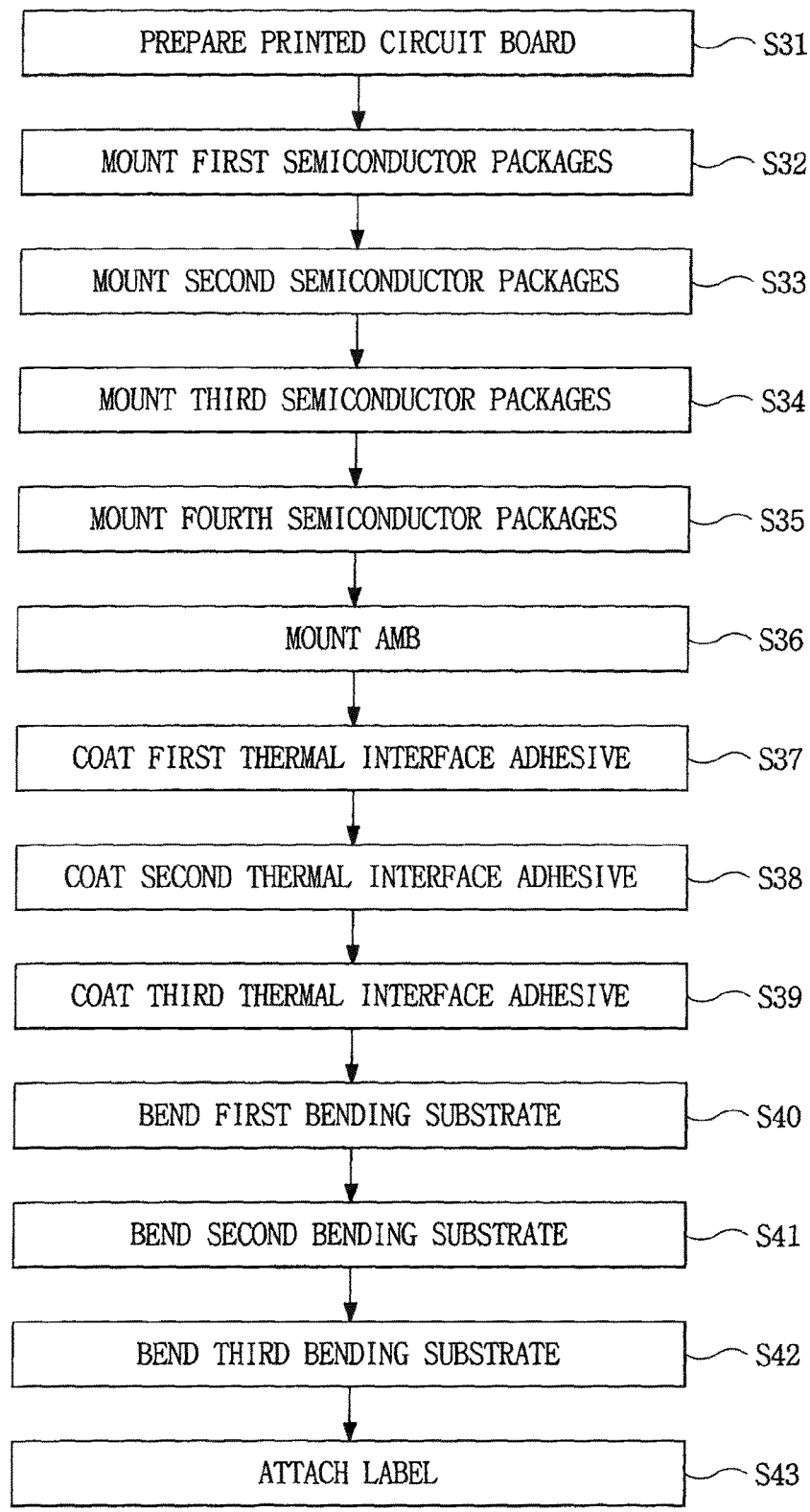
FIG. 18 is a flowchart showing a method of fabricating a memory module in accordance with a third exemplary embodiment of the present invention.

FIG. 18 is a flowchart showing a method of fabricating a memory module in accordance with a third exemplary embodiment of the present invention.

First, a printed circuit board 310 is prepared (S31) including a first interconnection substrate 311 in which a plurality of first signal lines 312 are arranged, a first heat sink 315 disposed on one surface of the first interconnection substrate 311 and in which no signal lines are arranged, a first bending substrate 317 coupling the first interconnection substrate 311 to the first heat sink 315 and formed of a flexible material to be bent, a second interconnection substrate 313 disposed on the other surface of the first interconnection substrate 311 and in which second signal lines 314 are arranged, a second bending substrate 318 coupling the second interconnection substrate 313 and the first interconnection substrate 311 and formed of a flexible material to be bent, a second heat sink 316 disposed on one surface of the second interconnection substrate 313 and in which no signal lines are arranged, and a third bending substrate 319 coupling the second interconnection substrate 313 to the second heat sink 316 and formed of a flexible material to be bent.

Then, when the printed circuit board 310 is prepared, a plurality of first semiconductor packages 331 and first passive devices 371 are mounted on an upper surface of the first interconnection substrate 311 to be electrically coupled to the first signal lines 312 (S32), and a plurality of second semiconductor packages 332 and second passive devices 372 are mounted on an upper surface of the second interconnection substrate 313 to be electrically coupled to the second signal lines 314 (S33). In addition, a plurality of third semiconductor packages 333 and third passive devices 373 are mounted on a lower surface of the second interconnection substrate 313 to be electrically coupled to the second signal lines 314 (S34), and a plurality of fourth semiconductor packages 334 and fourth passive devices 374 are mounted on a lower surface of the first interconnection substrate 311 to be electrically coupled to the first signal lines 312 (S35). Further, an AMB 350 is mounted on the lower surface of the second interconnection substrate 313 to be electrically coupled to the first and second signal lines 312 and 314 to transmit signals from the exterior to the first, second, third, and fourth semiconductor packages 331, 332, 333 and 334 (S36).

When the semiconductor packages 331, 332, 333 and 334 and the AMB 350 are mounted, a first thermal interface adhesive 361 may be coated on an upper surface of the first heat sink 315 to adhere the first semiconductor packages 331 thereto (S37), a second thermal interface adhesive 362 may be coated on a lower surface of the first heat sink 315 to adhere the second semiconductor packages 332 thereto (S38), and a third thermal interface adhesive 363 may be coated on a lower surface of the second heat sink 316 to adhere the third semiconductor packages 333 and the AMB 350 thereto (S39).

Then, when the thermal interface adhesives 361, 362 and 363 are coated, the first bending substrate 317 is bent to adhere the first semiconductor packages 331 to the upper surface of the first heat sink 315 by the first thermal interface adhesive 361 (S40). Therefore, the first semiconductor packages 331 are adhered to the upper surface of the first heat sink 315 by the first thermal interface adhesive 361.

Next, when the first bending substrate 317 is bent, the second bending substrate 318 is bent to adhere the second semiconductor packages 332 to the lower surface of the first heat sink 315 by the second thermal interface adhesive 362 (S41). Therefore, the second semiconductor packages 332 are adhered to the lower surface of the first heat sink 315.

Next, when the second bending substrate 318 is bent, the third bending substrate 319 is bent to adhere the third semiconductor packages 333 and the AMB 350 to the lower surface of the second heat sink 316 by the third thermal interface adhesive 363 (S42). Therefore, the third semiconductor packages 333 and the AMB 350 are adhered to the lower surface of the second heat sink 316.

Next, the third semiconductor packages 333 and the AMB 350 are adhered to the lower surface of the second heat sink 316, an operator may attach a label 390 to the lower surface of the second heat sink 316 (S43). Therefore, the method of fabricating a memory module 300 in accordance with a third exemplary embodiment of the present invention is completed.

Meanwhile, in addition to the first interconnection substrate 311, the second interconnection substrate 313, the first heat sink 315, the second heat sink 316, the first bending substrate 317, the second bending substrate 318, and the third bending substrate 319, other configurations are possible. For example, when the printed circuit board 310 prepared to manufacture the memory module 300 further includes a first tab terminal 322 coupling the second interconnection substrate 313 to the second bending substrate 318 and having third signal lines 323 coupled to the first and second signal lines 312 and 314 to transmit signals from the exterior to the AMB 350, a second tab terminal 324 disposed between the first interconnection substrate 311 and the second bending substrate 318 to couple the first interconnection substrate 311 to the second bending substrate 318 and having fourth signal lines 325 to be coupled to the first and second signal lines 312 and 314 to transmit signals from the exterior to the AMB 350, and fourth and fifth bending substrates 320 and 321 disposed between the tab terminals 322 and 324 and the interconnection substrates 311 and 313, an operator can adhere the first tab terminal 322 along one side of the upper surface of the first heat sink 315 and adhere the second tab terminal 324 along one side of the lower surface of the first heat sink 315 to correspond to the first tab terminal 322 using an adhesive (not shown). The operator may adhere the first and second tab terminals between a process of bending the first bending substrate 317 and a process of bending the second bending substrate 318.

As can be seen from the foregoing, in a printed circuit board, a memory module having the same and a fabrication method thereof in accordance with an exemplary embodiment of the present invention, since a heat sink for rapidly dissipating heat of electronic components is integrally formed with an interconnection substrate on which the electronic components are mounted, it is possible to improve thermal problems of the electronic components generated due to stacking of conventional memory modules.

In addition, since the heat sink for rapidly dissipating heat of electronic components is integrally formed with the interconnection substrate on which the electronic components are mounted and a bending substrate formed of a flexible material is disposed therebetween, it is possible to readily dispose the heat sink to be adjacent to the interconnection substrate. Therefore, using the heat sink disposed adjacent to the interconnection substrate, it is possible to improve thermal problems of the electronic components generated due to stacking of conventional memory modules.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory module comprising:
a printed circuit board comprising an interconnection substrate in which a plurality of signal lines are arranged, a heat sink disposed adjacent to a first surface of the interconnection substrate and in which no signal lines are arranged, and a bending substrate coupling the interconnection substrate to the heat sink;
a plurality of semiconductor packages mounted on the first surface of the interconnection substrate opposite to the heat sink, the semiconductor packages being electrically coupled to the signal lines; and
a thermal interface adhesive configured to adhere the semiconductor packages to a first surface of the heat sink opposite to the semiconductor packages, and configured to transmit heat from the semiconductor packages to the heat sink,
wherein the interconnection substrate has a first end portion and a second end portion opposite the first end portion of the interconnection substrate,
the heat sink has a first end portion and a second end portion opposite the first end portion of the heat sink, and
the bending substrate couples the first end portion of the interconnection substrate to the first end portion of the heat sink, wherein the interconnection substrate comprises a first interconnection substrate, wherein the signal lines comprise first signal lines, wherein the bending substrate comprises a first bending substrate, the printed circuit board further comprises a second interconnection substrate disposed adjacent to a second surface of the heat sink opposite to the first surface of the heat sink and having a plurality of second signal lines arranged therein, and a second bending substrate coupling the second interconnection substrate to the first interconnection substrate and formed of a flexible material, the first bending substrate couples a first end portion of the first interconnection substrate to a first end portion of the heat sink, the second bending substrate couples a second end portion of the first interconnection substrate to an end portion of the second interconnection substrate, and the second end portion of the first interconnection substrate is opposite to the first end portion of the first interconnection substrate.

2. The memory module according to claim 1, wherein the semiconductor packages comprise first semiconductor packages, and wherein the memory module further comprises:
a plurality of second semiconductor packages mounted on a second surface of the interconnection substrate opposite to the first surface of the interconnection substrate, the second semiconductor packages being electrically coupled to the signal lines.

3. The memory module according to claim 1, wherein the semiconductor packages comprise first semiconductor packages, wherein the thermal interface comprises a first thermal interface, and wherein the memory module further comprises:
a plurality of second semiconductor packages mounted on a second surface of the first interconnection substrate opposite to the first surface of the first interconnection substrate, the second semiconductor packages being electrically coupled to the first signal lines;
a plurality of third semiconductor packages mounted on a first surface of the second interconnection substrate opposite to the heat sink, the third semiconductor packages being electrically coupled to the second signal lines;
a plurality of fourth semiconductor packages mounted on a second surface of the second interconnection substrate opposite to the first surface of the second interconnection substrate, the fourth semiconductor packages being electrically coupled to the second signal lines; and
a second thermal interface adhesive configured to adhere the third semiconductor packages to the second surface of the heat sink opposite to the third semiconductor packages, and configured to transmit heat from the third semiconductor packages toward the heat sink.

4. The memory module according to claim 1, wherein the printed circuit board further comprises:
a first tab terminal disposed between the second interconnection substrate and the second bending substrate to couple the second interconnection substrate to the second bending substrate; and
a second tab terminal disposed between the first interconnection substrate and the second bending substrate to couple the first interconnection substrate to the second bending substrate.

5. The memory module according to claim 1, wherein the heat sink comprises a first heat sink, and wherein the printed circuit board further comprises:
a second heat sink disposed adjacent to a second surface of the second interconnection substrate opposite to a first surface of the second interconnection substrate, and in which no signal lines are arranged; and
a third bending substrate coupling the second interconnection substrate to the second heat sink.

6. The memory module according to claim 5, wherein the semiconductor packages comprise first semiconductor packages, wherein the thermal interface comprises a first thermal interface, and wherein the memory module further comprises:
a plurality of second semiconductor packages mounted on a second surface of the first interconnection substrate, the second semiconductor packages being electrically coupled to the first signal lines;
a plurality of third semiconductor packages mounted on the first surface of the second interconnection substrate, the third semiconductor packages being electrically coupled to the second signal lines;
a plurality of fourth semiconductor packages mounted on the second surface of the second interconnection substrate, the fourth semiconductor packages being electrically coupled to the second signal lines;
a second thermal interface adhesive configured to adhere the third semiconductor packages to the second surface of the first heat sink and configured to transmit heat from the third semiconductor packages toward the first heat sink; and
a third thermal interface adhesive configured to adhere the fourth semiconductor packages to a first surface of the second heat sink opposite to the fourth semiconductor packages and configured to transmit heat from the fourth semiconductor packages toward the second heat sink.

7. The memory module according to claim 1, further comprising an advanced memory buffer (AMB) mounted on the first surface of the interconnection substrate, the AMB being electrically coupled to the signal lines, and configured to transmit signals from the exterior to the first and second semiconductor packages.

* * * * *